(12) United States Patent
Suzuki

(10) Patent No.: US 11,971,364 B2
(45) Date of Patent: Apr. 30, 2024

(54) SEMICONDUCTOR DEVICE INSPECTION METHOD AND SEMICONDUCTOR DEVICE INSPECTION DEVICE

(71) Applicant: HAMAMATSU PHOTONICS K.K., Hamamatsu (JP)

(72) Inventor: Shinsuke Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 332 days.

(21) Appl. No.: 17/278,683

(22) PCT Filed: Jun. 25, 2019

(86) PCT No.: PCT/JP2019/025249
§ 371 (c)(1),
(2) Date: Mar. 23, 2021

(87) PCT Pub. No.: WO2020/066177
PCT Pub. Date: Apr. 2, 2020

(65) Prior Publication Data
US 2021/0270752 A1    Sep. 2, 2021

(30) Foreign Application Priority Data

Sep. 26, 2018 (JP) .................................. 2018-180647

(51) Int. Cl.
*G01N 21/95* (2006.01)
*G01N 21/88* (2006.01)
*G01R 31/26* (2020.01)

(52) U.S. Cl.
CPC ..... *G01N 21/9501* (2013.01); *G01N 21/8851* (2013.01); *G01R 31/26* (2013.01)

(58) Field of Classification Search
CPC .......... G01N 21/8851; G01N 21/9501; G01R 31/26; G01R 31/2656; G01R 31/311; G01R 31/303; G01R 31/308; G01R 31/31728
(Continued)

(56) References Cited

U.S. PATENT DOCUMENTS 6,104,481 A * 8/2000 Sekine ............... G01N 21/9501
356/237.4
2005/0219518 A1* 10/2005 Korngut ................. G01N 21/47
356/237.2
(Continued)

FOREIGN PATENT DOCUMENTS

CN    106198566 A    12/2016
CN    107210244 A    9/2017
(Continued)

OTHER PUBLICATIONS

International Preliminary Report on Patentability dated Apr. 8, 2021 for PCT/JP2019/025249.

*Primary Examiner* — Tri T Ton
(74) *Attorney, Agent, or Firm* — Faegre Drinker Biddle & Reath LLP

(57) ABSTRACT

A semiconductor device inspection method includes: performing a first inspection irradiation on at least one portion in an area to be inspected; outputting first information indicating presence or absence of a defective portion in an entire of the area to be inspected, based on the first inspection irradiation; when it is determined that a second inspection irradiation is to be performed, performing the inspection irradiation on at least one portion in the area to be inspected of the semiconductor device to which the test signal is being input, the portion of the second inspection irradiation is different from the portion of the first inspection irradiation; and outputting second information indicating presence or (Continued)

absence of a defective portion in the entire of the area to be inspected, based on the second inspection irradiation.

12 Claims, 8 Drawing Sheets

(58) Field of Classification Search
USPC .................. 356/237.1–237.6, 239.1–239.8
See application file for complete search history.

(56) References Cited

U.S. PATENT DOCUMENTS

| | | |
|---|---|---|
| 2007/0115003 A1 | 5/2007 | Nikawa |
| 2009/0003685 A1 | 1/2009 | Nikawa |

FOREIGN PATENT DOCUMENTS

| | | |
|---|---|---|
| JP | H09-145795 A | 6/1997 |
| JP | H11-160245 A | 6/1999 |
| JP | 2000-208577 A | 7/2000 |
| JP | 2004-327858 A | 11/2004 |
| JP | 2009-008627 A | 1/2009 |
| JP | 2009-300202 A | 12/2009 |
| JP | 2010-103320 A | 5/2010 |
| JP | 2012-222263 A | 11/2012 |
| JP | 2015-032686 A | 2/2015 |
| TW | 200921126 A | 5/2009 |

\* cited by examiner

SEMICONDUCTOR DEVICE INSPECTION METHOD AND SEMICONDUCTOR DEVICE INSPECTION DEVICE

TECHNICAL FIELD

The present invention relates to a semiconductor device inspection method and a semiconductor device inspection device.

BACKGROUND ART

A known semiconductor device inspection device inspects a defective portion of a semiconductor device (for example, Patent Literature 1). The semiconductor device inspection device scans a semiconductor device, to which a test signal is being input, with light. The test signal has a predetermined pattern. In the semiconductor device inspection device, a defective portion of a semiconductor device is inspected based on the output signal output from the semiconductor device. In scanning the semiconductor device with light, a plurality of portions in the area to be inspected of the semiconductor device are irradiated with light in synchronization with a predetermined period of a test signal.

CITATION LIST

Patent Literature

Patent Literature 1: Japanese Unexamined Patent Publication No. 2009-300202

SUMMARY OF INVENTION

Technical Problem

In the semiconductor device inspection device described in Patent Literature 1, one portion in the area to be inspected is irradiated with light while a predetermined pattern of a test signal is being input to the semiconductor device. Therefore, in order to inspect a defective portion in an entire of the area to be inspected, a time obtained by multiplying the period of the pattern of the test signal by the number of irradiation portions to be irradiated with light is required. In the semiconductor device inspection device described above, in order to shorten the time required to inspect a defective portion, the interval between light irradiation portions in the area to be inspected is increased. Therefore, since the number of irradiation portions is reduced, the time required to inspect the entire of the area to be inspected is shortened. As the interval between the irradiation portions becomes larger, the time required to inspect a defective portion becomes shorter.

However, if the interval between the irradiation portions in the area to be inspected is large, a defective portion in the area to be inspected may be overlooked. Therefore, in order to ensure the inspection accuracy while shortening the time required to inspect a defective portion, it is required to set the interval between irradiation portions to a value suitable for each configuration of a semiconductor device to be inspected.

An object of one aspect of the present invention is to provide a semiconductor device inspection method capable of easily shortening the time required for inspection while ensuring the accuracy of the inspection in inspecting a semiconductor device. An object of another aspect of the present invention is to provide a semiconductor device inspection device capable of easily shortening the time required for inspection while ensuring the accuracy of the inspection in inspecting a semiconductor device.

Solution to Problem

A semiconductor device inspection method according to one aspect of the present invention includes an inspection step. In the inspection step, inspection irradiation for emitting light while a test signal is being input to a semiconductor device is performed on an area to be inspected of the semiconductor device. Then, in the inspection step, the semiconductor device is inspected based on an output signal output from the semiconductor device in response to the inspection irradiation. The inspection step includes a first irradiation step, a first output step, a determination step, a second irradiation step, and a second output step. In the first irradiation step, the inspection irradiation is performed on at least one portion in the area to be inspected of the semiconductor device to which the test signal is being input. In the first output step, first information indicating presence or absence of a defective portion in an entire of the area to be inspected is output based on the output signal output from the semiconductor device during the first irradiation step. In the determination step, whether or not to further perform the inspection irradiation on the area to be inspected is determined based on the first information. In the second irradiation step, when it is determined in the determination step that the inspection irradiation is to be further performed, the inspection irradiation is performed on the semiconductor device to which the test signal is being input. The inspection irradiation is performed on at least one portion in the area to be inspected, which is different from the portion where the inspection irradiation has been performed in the first irradiation step. In the second output step, second information indicating presence or absence of a defective portion in the entire of the area to be inspected is output based on the output signal output from the semiconductor device during the second irradiation step.

In the one aspect described above, in the first irradiation step, inspection irradiation is performed on at least one portion in the area to be inspected. In the second irradiation step, the inspection irradiation is performed on a portion in the area to be inspected, which is different from the portion where the inspection irradiation has been performed in the first irradiation step. Therefore, even if the information of a defective portion is missing in the first information based on the first irradiation step, the defective portion is detected by the second information based on the second irradiation step. In this case, the accuracy of the inspection is ensured regardless of the position of the irradiation portion in the first irradiation step. In this inspection method, the first information indicating the presence or absence of a defective portion in the entire of the area to be inspected is output in the first output step, and whether or not to perform the second irradiation step is determined based on the first information. Therefore, when a defective portion is detected according to the inspection based on the first information, the number of irradiation portions to be irradiated with light until the defective portion is detected is reduced. In this case, the time required for inspection is significantly reduced. Therefore, in the semiconductor device inspection method described above, the time required for inspection can be easily shortened while ensuring the accuracy of the inspection.

In the one aspect described above, an image generation step may be further included. In the image generation step, a two-dimensional image of the area to be inspected indicating the presence or absence of a defective portion in the entire of the area to be inspected may be generated based on the output signal output from the semiconductor device during the first irradiation step. In this case, since a two-dimensional image indicating whether or not a defective portion is present is generated based on the output signal during the first irradiation step, the user can easily determine whether or not to perform the second irradiation step by viewing the image.

In the one aspect described above, in the first irradiation step, a first scan may be performed in the area to be inspected, and the inspection irradiation may be performed in the first scan. In the second irradiation step, a second scan of which a scan range overlaps that of the first scan may be performed in the area to be inspected, and the inspection irradiation may be performed in the second scan. In this case, since the scan ranges of the first irradiation step and the second irradiation step overlap each other, the accuracy of the inspection is more easily ensured.

In the one aspect described above, one of portions where the inspection irradiation is performed in one of the first irradiation step or the second irradiation step may be located within a region of which diagonal or diameter is a line segment passing through two of portions where the inspection irradiation is performed in the other one of the first irradiation step or the second irradiation step. It is difficult to grasp a detectable range from the position irradiated with light. According to the inspection method, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed. If the overlap between the ranges where a defective portion can be detected is suppressed, the time required for inspection can be further shortened.

In the one aspect described above, one of the portions where the inspection irradiation is performed in one of the first irradiation step or the second irradiation step may be located between two of the portions where the inspection irradiation is performed in the other one of the first irradiation step or the second irradiation step. In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

In the one aspect described above, at least two of portions where the inspection irradiation is performed in one of the first irradiation step or the second irradiation step may be located equidistant from one of portions where the inspection irradiation is performed in the other one of the first irradiation step or the second irradiation step. In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

In the one aspect described above, the number of portions where the inspection irradiation is performed in the first irradiation step may be smaller than the number of portions where the inspection irradiation is performed in the second irradiation step. According to this inspection method, when the range in which a defective portion can be detected in the first output step and the range in which a defective portion can be detected in the second output step overlap each other, the time required for inspection can be further shortened.

In the one aspect described above, a portion where the inspection irradiation is performed in one of the first irradiation step or the second irradiation step may be located in each of a plurality of regions. The plurality of regions may be regions obtained by dividing the area to be inspected of the semiconductor device into four parts by a straight line passing through at least one of portions where the inspection irradiation is performed in the other one of the first irradiation step or the second irradiation step. In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

In the one aspect described above, a plurality of portions where the inspection irradiation is performed in at least one of the first irradiation step or the second irradiation step may be located at equal intervals from each other. In this case, portions irradiated with light in at least one of the first irradiation step or the second irradiation step are arranged in a well-balanced manner. Therefore, the overlap between the ranges where a defective portion can be detected is suppressed.

In the one aspect described above, the inspection step may further include a third irradiation step and a third output step. In the third irradiation step, when it is determined that the inspection irradiation is to be further performed based on the second information, the inspection irradiation may be further performed on at least one portion in the area to be inspected, which is different from portions where the inspection irradiation has been performed in the first irradiation step and the second irradiation step, in the semiconductor device to which the test signal is being input. In the third output step, third information indicating presence or absence of a defective portion in the entire of the area to be inspected may be output based on the output signal output from the semiconductor device during the third irradiation step. At least one of portions where the inspection irradiation is performed in the third irradiation step may be located between one of portions where the inspection irradiation has been performed in the first irradiation step and one of portions where the inspection irradiation has been performed in the second irradiation step.

In this case, the irradiation step and the output step are divided into at least three stages. Therefore, if a defective portion is detected in the inspection based on the first output step or the second output step, the time required for inspection is shortened. In the third irradiation step, the inspection irradiation is performed on an irradiation portion in the area to be inspected, which is different from the portion where the inspection irradiation has been performed in the first irradiation step and the second irradiation step. Therefore, even if the information of a defective portion is missing in the first information based on the first irradiation step and the second information based on the second irradiation step, the defective portion can be detected by the third information based on the third irradiation step. At least one of the portions irradiated with light in the third irradiation step is located between one of the portions irradiated with light in the first irradiation step and one of the portions irradiated with light in the second irradiation step. Therefore, the ranges in which a defective portion can be detected in the first output step, the second output step, and the third output step are difficult to overlap each other.

A semiconductor device inspection device according to another aspect of the present invention includes a light irradiation unit, an irradiation portion setter, an irradiation controller, an analyzer, and a scan determiner. The light irradiation unit is configured to irradiate an area to be inspected of a semiconductor device with light. The irradiation portion setter is configured to set at least one portion in the area to be inspected as an irradiation portion of inspection irradiation. In the inspection irradiation, the area to be inspected is irradiated with light while a test signal is being input to the semiconductor device. The irradiation controller is configured to control the light irradiation unit to perform the inspection irradiation on the irradiation portion set by the irradiation portion setter in the semiconductor device to which the test signal is being input. The analyzer is configured to output information indicating presence or absence of a defective portion in an entire of the area to be inspected based on an output signal output from the semiconductor device while the inspection irradiation is being performed by the light irradiation unit on the irradiation portion set by the irradiation portion setter. The scan determiner is configured to determine whether or not the inspection irradiation is to be further performed on the area to be inspected by the light irradiation unit after the analyzer outputs the information. When the scan determiner determines that the inspection irradiation is to be further performed, the irradiation portion setter newly sets at least one portion in the area to be inspected, which is different from a portion already set as the irradiation portion and irradiated with light, as the irradiation portion. The irradiation controller controls the light irradiation unit to perform the inspection irradiation on the irradiation portion newly set by the irradiation portion setter.

In another aspect described above, the irradiation portion setter sets at least one portion in the area to be inspected as an irradiation portion where the inspection irradiation is to be performed by the light irradiation unit. The irradiation controller controls the light irradiation unit to perform inspection irradiation on the irradiation portion set by the irradiation portion setter in the semiconductor device to which the test signal is being input. When the scan determiner determines that the inspection irradiation is to be further performed, the irradiation portion setter newly sets at least one portion in the area to be inspected, which is different from the portion already set as an irradiation portion and irradiated with light, as an irradiation portion. Therefore, even if the information of a defective portion is missing in the output from the analyzer based on the previous inspection irradiation, the defective portion is detected by the output from the analyzer based on the subsequent inspection irradiation. In this case, the accuracy of the inspection is ensured regardless of the position of the irradiation portion in the previous inspection irradiation. In this inspection device, information indicating the presence or absence of a defective portion in the entire of the area to be inspected is output from the analyzer, and after the information is output, whether or not to further perform the inspection irradiation on the area to be inspected by the light irradiation unit is determined. Therefore, when a defective portion is detected according to the inspection based on the previous inspection irradiation, the number of irradiation portions to be irradiated with light until the defective portion is detected is reduced. As a result, the time required for inspection can be significantly shortened. That is, in the semiconductor device inspection device described above, the time required for inspection can be easily shortened while ensuring the accuracy of the inspection.

In another aspect described above, the analyzer may generate a two-dimensional image of the area to be inspected, which indicates presence or absence of a defective portion in the entire of the area to be inspected, based on the output signal output from the semiconductor device while the light irradiation unit is performing the inspection irradiation on the irradiation portion set by the irradiation portion setter, and may output the generated image as the information. In this case, since a two-dimensional image indicating whether or not the defective portion is present is generated, the user can easily determine whether or not to perform further inspection irradiation by viewing the image.

In another aspect described above, the irradiation controller may cause the light irradiation unit to scan the area to be inspected so that the inspection irradiation is performed on the irradiation portion set by the irradiation portion setter in the scan. When the scan determiner determines that the inspection irradiation is to be further performed, the irradiation controller may control the light irradiation unit to scan a range overlapping a range having already been scanned, so that the inspection irradiation is performed on the newly set irradiation portion in the scan. In this case, since the scan ranges of the previous scan and the subsequent scan overlap each other, the accuracy of the inspection is more easily ensured.

Advantageous Effects of Invention

One aspect of the present invention provides a semiconductor device inspection method capable of easily shortening the time required for inspection while ensuring the accuracy of semiconductor device inspection. Another aspect of the present invention provides a semiconductor device inspection device capable of easily shortening the time required for inspection while ensuring the accuracy of semiconductor device inspection.

BRIEF DESCRIPTION OF DRAWINGS

FIG. 4 is a diagram for describing an irradiation portion.

FIG. 8 is a diagram for describing the function and effect of a semiconductor device inspection device.

DESCRIPTION OF EMBODIMENTS

Figure 1:
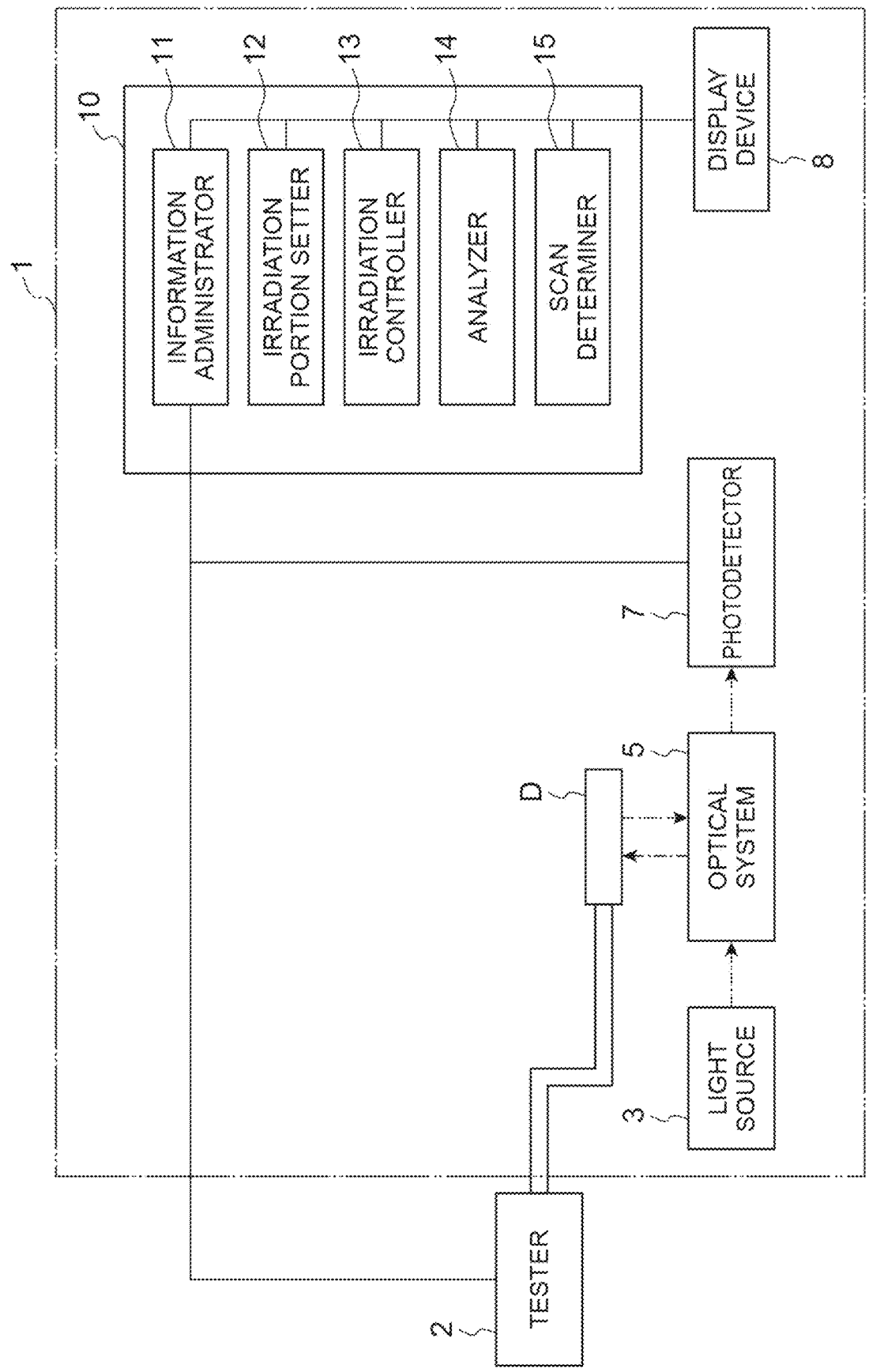
FIG. 1 is a schematic block diagram illustrating the configuration of a semiconductor device inspection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

First, the configuration of a semiconductor device inspection device according to the present embodiment will be described with reference to FIG. 1. FIG. 1 is a schematic block diagram illustrating the configuration of the semiconductor device inspection device according to the present embodiment.

As illustrated in FIG. 1, a semiconductor device inspection device 1 according to the present embodiment acquires a result signal that is output according to the input of a test signal to a semiconductor device D as an object to be inspected. Hereinafter, the semiconductor device inspection device is simply referred to as an "inspection device". The inspection device 1 is used for soft defect localization (SDL) measurement and laser assisted device alteration (LADA) measurement, for example. The semiconductor device D is formed, for example, by building a plurality of elements on a silicon substrate. That is, the semiconductor device D is configured by a silicon substrate. The semiconductor device D is, for example, an individual semiconductor element (discrete), an optoelectronic element, a sensor/actuator, a logic large scale integration (LSI), a memory element, a linear integrated circuit (IC), or a hybrid device thereof. Examples of the individual semiconductor element include a diode and a power transistor. The logic LSI is configured by, for example, a transistor having a metal-oxide-semiconductor (MOS) structure and a transistor having a bipolar structure. The semiconductor device D may be a package including a semiconductor device, a composite substrate, and the like.

An LSI tester 2 is electrically connected to the semiconductor device D. The LSI tester 2 inputs a test pattern signal as a test signal to the semiconductor device D. The test pattern signal is an analysis signal in which a signal of a predetermined pattern loops at a predetermined cycle. The pattern of the test pattern signal is set by the user, for example. The LSI tester 2 generates a result signal indicating Pass/Fail information based on the output signal that is output from the semiconductor device D according to the input of the test pattern signal. For example, the LSI tester 2 compares the output signal output from the semiconductor device D with a correctly designed output signal for the test pattern signal, and outputs a change in Pass/Fail information based on the comparison result as a result signal. The inspection device 1 inspects a defective portion of an area to be inspected R of the semiconductor device D based on the result signal.

In addition, the LSI tester 2 outputs various signals corresponding to the generated result signal and the test pattern signal. In the present embodiment, the LSI tester 2 outputs, for example, a loop trigger signal synchronized with the test pattern signal. The trigger timing of the loop trigger signal matches a timing at which the input of the test pattern signal in each loop starts. That is, the trigger timing of the loop trigger signal matches a reset timing. The LSI tester 2 also serves as a power supply device, and inputs a preset current to the semiconductor device D. The current input to the semiconductor device D is set in advance so as to be a driving voltage and a driving frequency at which Pass/Fail information in the result signal is likely to change. The power supply device (not illustrated) may be configured to input a preset current to the semiconductor device D separately from the LSI tester 2. When the semiconductor device D has a function of the LSI tester, it is not necessary to prepare an external LSI tester.

The inspection device 1 includes a light source 3, an optical system 5, a photodetector 7, a display device 8, and a control device 10. The light source 3 generates and outputs continuous wave (CW) light that is emitted to the semiconductor device D. The light source 3 may output pulsed light. The light output from the light source 3 may be incoherent light or coherent light, such as laser light. As the light source 3 that outputs incoherent light, a super luminescent diode (SLD), an amplified spontaneous emission (ASE), a light emitting diode (LED), and the like can be used.

As the light source 3 that outputs coherent light, a solid-state laser light source, a semiconductor laser light source, and the like can be used. The LSI tester 2 and the light source 3 may be electrically connected to each other (not illustrated) so that the light generated by the light source 3 is changed according to the signal output from the LSI tester 2. For example, pulsed light may be output from the light source 3 so as to synchronize with the signal output from the LSI tester 2.

In the case of SDL measurement, in order to obtain the effect of heating in the semiconductor device D, it is preferable that the light generated from the light source 3 has a wavelength at which the photon energy is smaller than the band gap of silicon. As an example, the wavelength of the light generated from the light source 3 may be about 1300 μm. In the case of LADA measurement, in order to generate a photovoltaic current in the semiconductor device D, the light generated from the light source 3 has a wavelength at which the photon energy is larger than the band gap of silicon. As an example, the wavelength of the light generated from the light source 3 may be about 1064 nm. The above wavelength is a wavelength when a silicon substrate is used as the semiconductor device D. When the semiconductor device D is configured by a substrate, such as silicon carbide (SiC), sapphire, or a compound semiconductor, a wavelength suitable for these is appropriately selected. The light output from the light source 3 is incident on the optical system 5.

The optical system 5 (light irradiation unit) performs a light scan on the semiconductor device D, and emits light output from the light source 3 to the semiconductor device D. More specifically, the optical system 5 emits light to a predetermined portion of the semiconductor device D and scans the area to be inspected R of the semiconductor device D.

"Light scan" means moving a position irradiated with emission light from the optical system. "Scan" means that the optical system 5 operates so that the position irradiated with light by the optical system 5 moves, and includes a state in which the area to be inspected R is not actually irradiated with light. In the present embodiment, a scan performed to obtain one measurement result for the entire area to be inspected R is defined as one scan. In the present embodiment, a scan is performed in the two-dimensional area to be inspected R, and a scan is not performed again at a position where a scan has been performed once in one scan. In the present embodiment, in the subsequent scan, a range overlapping the range in the previous scan is scanned.

In the present embodiment, in one scan, the optical system 5 starts scanning from a predetermined start position of the area to be inspected R and performs a raster scan up to a predetermined end position of the area to be inspected R. Thereafter, when further performing a scan, the optical system 5 starts scanning again from a predetermined start position according to the next scan. The start position and the end position are determined for each scan. The optical system 5 may necessarily return to a preset reference position after the end of each scan and then perform a scan.

The optical system 5 is configured by optically coupling an optical scanning element, an optical splitting optical system, an objective lens, and the like. For example, the optical scanning element is configured by a galvano mirror, a micro electro mechanical system (MEMS) mirror, or a polygon mirror. The optical splitting optical system may be configured by a polarizing beam splitter and a quarter wave plate, or may be configured by a half mirror. The objective lens may be configured by, for example, an objective lens having a plurality of magnifications, and the plurality of objective lenses may be freely switched by a revolver.

The photodetector 7 detects reflection light from the semiconductor device D according to the emitted light, and outputs a detection signal. The photodetector 7 is, for example, a photodiode, an avalanche photodiode, a photomultiplier tube, or an area image sensor. The photodetector 7 has at least one detector, and detects the intensity of light detected by the detector.

The display device 8 displays an inspection result for the semiconductor device D. The display device 8 is, for example, a liquid crystal monitor.

The control device 10 processes various signals output from the LSI tester 2, and controls the light source 3, the optical system 5, the photodetector 7, and the LSI tester 2. In the present embodiment, the control device 10 includes an information administrator 11, an irradiation portion setter 12, an irradiation controller 13, an analyzer 14, and a scan determiner 15. The control device 10 is configured by, for example, a computer including a CPU as a processor and a RAM and a ROM as recording media, and has an input unit, such as a mouse and a keyboard. The control device 10 may be configured by a plurality of computers.

The information administrator 11 stores various kinds of predetermined information and acquired information, and appropriately transmits the information to the irradiation portion setter 12, the irradiation controller 13, the analyzer 14, and the scan determiner 15. The information administrator 11 is electrically connected to the LSI tester 2, the light source 3, the optical system 5, and the photodetector 7, and acquires various kinds of information from these. The information administrator 11 acquires information indicating a defective portion in the area to be inspected R, that is, information indicating a change in the Pass/Fail state, from the output signal output from the semiconductor device D. The information administrator 11 acquires a detection signal of reflection light from the photodetector 7. For example, the information administrator 11 also acquires information regarding the irradiation portion, the scanning speed, and the timing of irradiating the irradiation portion with light. When the light output from the light source 3 is pulsed light, the information administrator 11 may acquire information regarding the intensity of the pulsed light and the irradiation timing of the pulsed light.

The irradiation portion setter 12 sets at least one portion in the area to be inspected R of the semiconductor device D as an irradiation portion to be irradiated with light by the optical system 5. The irradiation portion setter 12 sets, for each scan, at least one portion to be irradiated with light in the scan as an irradiation portion, and transmits the set irradiation portion to the irradiation controller 13. In the present embodiment, for each scan, the irradiation portion setter 12 acquires an irradiation portion for each scan stored in advance from the information administrator 11, and sets the acquired irradiation portion as an irradiation portion in the scan.

The irradiation portion for each scan, which is stored in advance in the information administrator 11, is an irradiation portion determined by performing a calculation in advance by the irradiation portion setter 12. In the present embodiment, for each inspection of the semiconductor device D, the irradiation portion setter 12 determines an irradiation portion for each scan at the start of the inspection. The irradiation portion setter 12 stores the determined irradiation portion for each scan in the information administrator 11.

The irradiation controller 13 controls the operation of the optical system 5, so that the optical system 5 scans the area to be inspected R of the semiconductor device D. The irradiation controller 13 causes the optical system 5 to perform an operation of irradiating the area to be inspected R with light while the test pattern signal is being input. Hereinafter, the operation of irradiating the area to be inspected R with light while the test pattern signal is being input is referred to as "inspection irradiation".

The irradiation controller 13 moves a light scanning position according to the loop trigger signal synchronized with the test pattern signal. Therefore, at an arbitrary position in the semiconductor device D, the timing of light irradiation by the optical system 5 and the timing of the input of the test pattern signal by the LSI tester 2 can be made to match each other. The irradiation controller 13 controls the optical system 5 so that, in each scan, the inspection irradiation is performed on at least one irradiation portion set by the irradiation portion setter 12 in the semiconductor device D to which the test signal is being input. In the present embodiment, CW light is output from the light source 3, and the irradiation controller 13 performs inspection irradiation on the irradiation portion by performing a light scan with the optical system 5.

The irradiation controller 13 may control the operation of the optical system 5 so that a portion other than the irradiation portion in the area to be inspected R is not irradiated with light. For example, the irradiation controller 13 may control the optical system 5 so that the light output from the light source 3 is blocked by a mask at a time other than a time during which the irradiation portion is irradiated with light. The irradiation controller 13 may control the light source 3 so that only the irradiation portion is irradiated with light. The irradiation controller 13 may control the light source 3 so that the pulsed light is output from the light source 3 in synchronization with the test pattern signal. In these cases, it is possible to prevent the information of the output signal output from the semiconductor device D from being input to the control device 10 in a state in which a portion other than the irradiation portion is irradiated with light.

The LSI tester 2 may be set so that the test signal or the result signal is not output from the LSI tester 2 while a portion other than the irradiation portion is being irradiated with light. The information of the result signal output from the LSI tester 2 to the control device 10 while a position other than the irradiation portion is being irradiated with light may be cut by the information administrator 11.

The analyzer 14 acquires, from the information administrator 11, position information of a portion irradiated with light by the optical system 5 and information indicating a change in the Pass/Fail state. The information indicating the change in the Pass/Fail state is a signal based on the result signal output from the LSI tester 2. In other words, the information indicating the change in the Pass/Fail state is a signal based on the output signal that is output from the semiconductor device D while the optical system 5 is performing inspection irradiation on the irradiation portion set by the irradiation portion setter 12.

The analyzer 14 associates the position information of the light irradiation portion with the information indicating the change in the Pass/Fail state, and outputs information indicating the presence or absence of a defective portion in the entire area to be inspected R as a measurement result. In the present embodiment, after the end of each scan, the analyzer 14 outputs information indicating the presence or absence of a defective portion in the entire area to be inspected R based on the information indicating the change in the Pass/Fail state acquired in the scan. In the present embodiment, the analyzer 14 generates a two-dimensional image of the area to be inspected R by associating the position information of the light irradiation portion with the information indicating the change in the Pass/Fail state, and outputs the generated two-dimensional image. The two-dimensional image corresponds to information indicating the presence or absence of a defective portion in the entire area to be inspected. That is, the analyzer 14 generates a measurement image in which information indicating a change in the Pass/Fail state is mapped according to the light irradiation portion.

The analyzer 14 acquires, from the information administrator 11, the position information of the portion irradiated with light by the optical system 5 and the information of the detection signal from the photodetector 7. The analyzer 14 generates a pattern image, which is an optical image of the semiconductor device D, by associating the position information of the portion irradiated with light by the optical system 5 and the information of the detection signal from the photodetector 7, and outputs the generated pattern image. The pattern image indicates the circuit pattern of the semiconductor device D. The analyzer 14 may generate an image by superimposing a measurement image on the pattern image. The analyzer 14 outputs the generated measurement image, pattern image, or image obtained by superimposing the measurement image on the pattern image to the display device 8. The display device 8 displays the image output from the analyzer 14. Therefore, it is possible to check a position that seems to be a failure portion on the circuit pattern.

The scan determiner 15 determines whether or not to perform inspection irradiation on the area to be inspected R by the optical system 5. When the scan determiner 15 determines that the inspection irradiation is to be performed, the irradiation portion setter 12 sets an irradiation portion. The scan determiner 15 determines whether or not to further perform the inspection irradiation on the area to be inspected R based on the information output from the analyzer 14. In other words, the scan determiner 15 determines whether or not to perform a scan again based on the information output from the analyzer 14. For example, the scan determiner 15 detects an operation of giving an instruction to inspect the semiconductor device D, which is performed by the user who has checked the information from the analyzer 14, and determines that the inspection irradiation is to be performed according to the detection. The scan determiner 15 may determine whether or not to further perform the inspection irradiation on the area to be inspected R directly from the information output from the analyzer 14. At least, the scan determiner 15 determines whether or not to further perform the inspection irradiation after the measurement result is output from the analyzer 14. As described above, the measurement result output from the analyzer 14 is information indicating the presence or absence of a defective portion in the entire area to be inspected R.

When the scan determiner 15 makes a direct determination from the information output from the analyzer 14, the scan determiner 15 determines the presence or absence of a defective portion in the entire area to be inspected R based on the measurement result from the analyzer 14, for example. When it is determined that no defective portion has been detected in the entire area to be inspected R, the scan determiner 15 may determine that the inspection irradiation is to be further performed on the area to be inspected R. When it is determined that a defective portion has been detected in the entire area to be inspected R, the scan determiner 15 may determine that the inspection irradiation is not to be performed on the area to be inspected R.

When the scan determiner 15 determines that the inspection irradiation is to be further performed, the irradiation portion setter 12 newly sets at least one portion in the area to be inspected R, which is different from the portion already set as an irradiation portion and irradiated with light, as an irradiation portion. The irradiation controller 13 controls the optical system 5 so that a scan is performed in a range overlapping the range that has already been scanned and inspection irradiation is performed on the irradiation portion newly set by the irradiation portion setter 12.

Figure 2:
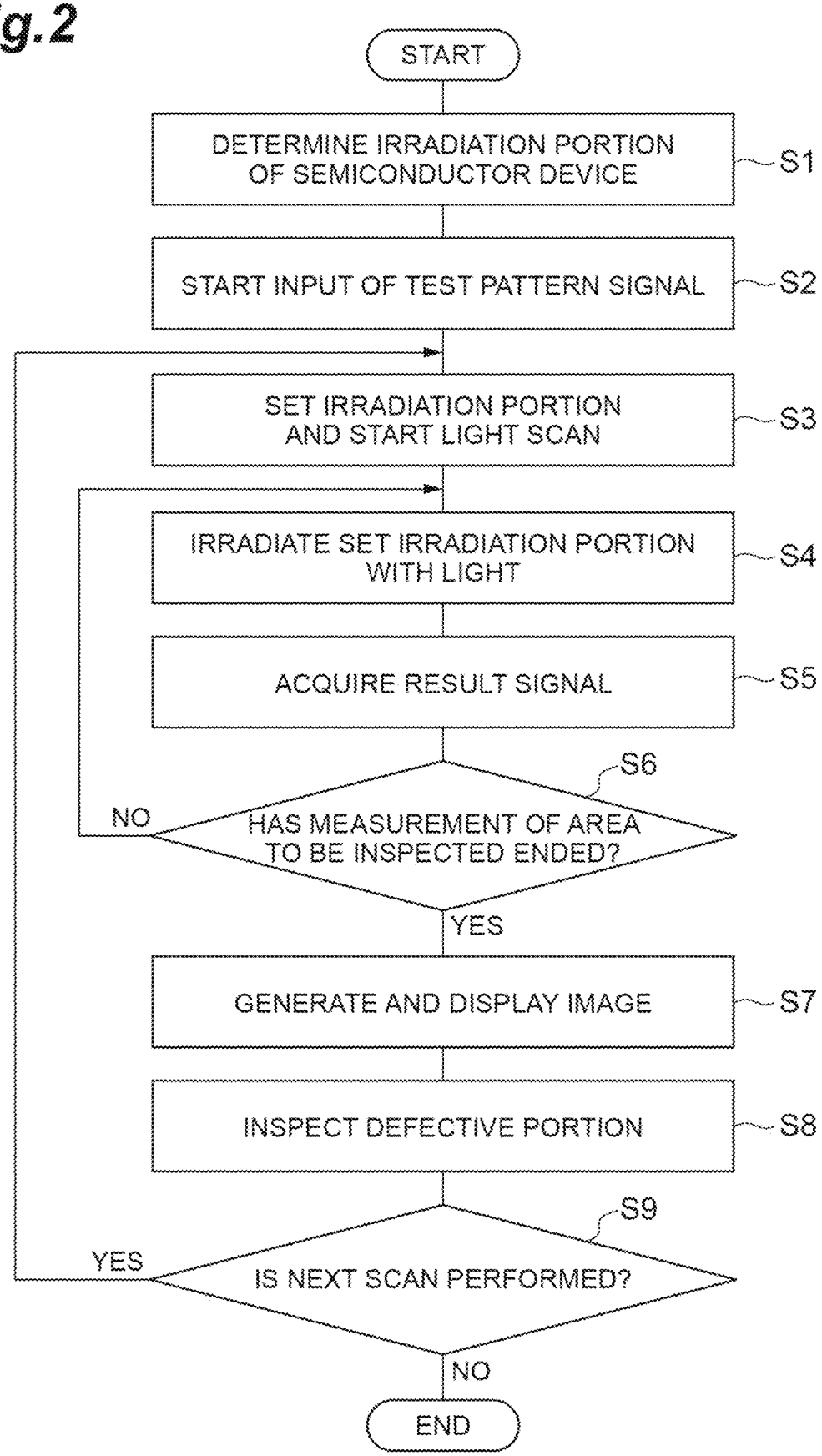
FIG. 2 is a flowchart illustrating a semiconductor device inspection method according to the present embodiment.

Next, a method of inspecting the semiconductor device D using an inspection device 1 according to the present embodiment and a modification example will be described with reference to FIG. 2. FIG. 2 is a flowchart illustrating a semiconductor device inspection method. In the present embodiment, the conditions of the test pattern signal input to the semiconductor device D, the area for executing the measurement on the semiconductor device D, and the like are set by the user before the inspection step of inspecting the semiconductor device. A current having a driving voltage and a driving frequency near the boundary where the Pass/Fail state of the semiconductor device D changes is applied to the semiconductor device D by the LSI tester 2. As a result, the semiconductor device D is driven. For example, in the case of SDL measurement in which the semiconductor device D is heated by laser light, the conditions of the driving voltage and the driving frequency near the boundary where the Pass/Fail state changes are calculated in advance. In this case, the conditions of the driving voltage and the driving frequency may be calculated by using the Shum plot when the entire semiconductor device D is heated by a heater or the like.

In the inspection method according to the present embodiment, first, the irradiation portion setter 12 determines an irradiation portion, which is to be irradiated with light, in the semiconductor device D in each scan (step S1). Then, the LSI tester 2 starts inputting a test pattern signal to the semiconductor device D (step S2). When the test pattern signal is output from the LSI tester 2 in step S2, the LSI tester 2 also outputs a loop trigger signal synchronized with the test pattern signal.

Then, the irradiation portion setter 12 sets an irradiation portion corresponding to the scan, and the irradiation controller 13 starts a light scan in the area to be inspected R of the semiconductor device D (step S3). In step S3, the irradiation portion setter 12 sets at least one portion in the area to be inspected R as an irradiation portion to be subjected to inspection irradiation.

Then, the irradiation controller 13 performs a scan in the area to be inspected R, and the optical system 5 performs inspection irradiation on the irradiation portion set in step S2 in the semiconductor device D to which the test pattern signal is being input (step S4). In step S4, the test pattern signal is being input to the semiconductor device D in a state in which each irradiation portion is irradiated with light. The output signal output from the semiconductor device D is being input to the LSI tester 2.

Then, the result signal that is output from the LSI tester 2 according to the input of the output signal to the LSI tester 2 is acquired by the information administrator 11 (step S5). The result signal is a signal indicating a change in the Pass/Fail state of the semiconductor device D due to light irradiation. In step S5, the photodetector 7 detects reflection light reflected by the semiconductor device. The signal of the detected reflection light is acquired by the information administrator 11.

Then, the irradiation controller 13 determines whether or not the measurement of the area to be inspected R has ended (step S6). That is, the irradiation controller 13 determines whether or not one scan for the area to be inspected R has been completed. When one scan is completed, inspection irradiation on all the irradiation portions set by the irradiation portion setter 12 in step S3 is also completed. When it is determined that the scan has not ended (NO in step S6), the operation returns to step S4. When it is determined that the scan has ended (YES in step S6), the operation proceeds to step S7.

When it is determined that the scan has ended, the analyzer 14 generates a two-dimensional image of the area to be inspected R, and the image is displayed on the display device 8 (step S7). The generated two-dimensional image is a measurement image, which is an image in which the position information of the light irradiation portion and the information indicating a change in the Pass/Fail state are associated with each other. The displayed image may be an image in which the measurement image is superimposed on the pattern image that is an optical image of the semiconductor device D. The position information of the light irradiation portion in the entire area to be inspected R and the information indicating a change in the Pass/Fail state may be output from the analyzer 14 in a method different from the display of the image. In other words, in step S7, information indicating the presence or absence of a defective portion in the entire area to be inspected R is output based on the output signal that is output from the semiconductor device D during the inspection irradiation in the loop of steps S4 to S6.

Then, the user inspects the defective portion based on the information output in step S7 (step S8). In the present embodiment, the user views the image displayed on the display device 8 to inspect the defective portion of the area to be inspected R.

Then, the scan determiner 15 determines whether or not to further perform a scan (step S9). The scan determiner 15 determines whether or not to further perform a scan based on the information output from the analyzer 14. The scan determiner 15 may perform the above determination based on an operation performed by the user who has checked the information from the analyzer 14. In other words, in step S9, it is determined whether or not to perform the inspection irradiation on the area to be inspected R based on the information output in step S7.

When it is determined that a scan is to be further performed (YES in step S9), the operation returns to step S3, and steps S3 to S9 are performed again as reprocessing. In the reprocessing, processes based on the previous processing are performed. This point will be described in more detail below.

In step S3 of the reprocessing, the irradiation portion setter 12 newly sets an irradiation portion in at least one portion in the area to be inspected R, which is different from the portion where the inspection irradiation has already been performed. Then, in step S4, the irradiation controller 13 performs a scan in the area to be inspected R, and the optical system 5 performs inspection irradiation on the newly set irradiation portion in the semiconductor device D to which the test pattern signal is being input. In step S4 of the reprocessing, a scan of which a scan range overlaps that of the scan in the previous processing is performed.

When the measurement of the area to be inspected R ends for the irradiation portion newly set in the loop of steps S4 to S6 of the reprocessing, the operation proceeds to step S7. In step S7, information indicating the presence or absence of a defective portion in the entire area to be inspected R is output based on the output signal that is output from the semiconductor device D during the inspection irradiation in the loop of steps S4 to S6. Thereafter, in step S8, the defective portion is inspected.

When it is determined that no scan is to be performed in step S9 (NO in step S9), all the processes are ended.

Next, the control of light irradiation by the irradiation portion setter 12 and the irradiation controller 13 of the inspection device 1 according to the present embodiment will be described in more detail with reference to FIGS. 3 and 4.

The irradiation portion setter 12 determines an irradiation portion for each scan at the start of inspection of the semiconductor device D, and sets the irradiation portion determined in advance at the start of each scan. Next, the procedure for determining the irradiation portion by the irradiation portion setter 12 will be specifically described. In the present embodiment, the area to be inspected R of the semiconductor device D has a square shape in plan view.

The irradiation portion setter 12 divides the area to be inspected R of the semiconductor device D into portions of N rows and N columns. Hereinafter, each portion will be referred to as a point. In the present embodiment, the position of each point is expressed with the position of an upper left point as a reference position (1, 1). The number on the left side in parentheses indicates a position in the row direction, that is, a column number. The number on the right side in parentheses indicates a position in the column direction, that is, a row number. The irradiation portion setter 12 divides the area to be inspected R into N×N points of (1, 1) to (N, N). The irradiation portion setter 12 sets the position (1, 1) as a reference position. "N" satisfies the value of "$F_n$" expressed by the recurrence relation of $F_n=2(F_{n-1})-1$. "n" is a natural number of 1 or more. The initial value of the recurrence relation is $F_0=2$. That is, "N" is, for example, $F_1=3$, $F_2=5$, $F_3=9$, $F_4=17$, $F_5=33$, $F_6=65$, $F_7=129$, $F_8=257$, $F_9=513$, $F_{10}=1025$. In FIG. 3, N is $F_3=9$, and the area to be inspected R is divided into 9 rows and 9 columns.

First, a case where n=1 and N=3 will be described. In this case, the area to be inspected R is 3 rows and 3 columns. In this case, the irradiation portion setter 12 determines the point located at the center of the area to be inspected R as a portion to be irradiated with light in the first scan. Specifically, the irradiation portion setter 12 determines (2, 2) as a portion to be irradiated with light in the first scan. Then, the irradiation portion setter 12 determines the points located at the four corners of the area to be inspected R as portions to be irradiated with light in the second scan. Specifically, the irradiation portion setter 12 determines (1, 1), (1, 3), (3, 1), and (3, 3) as portions to be irradiated with light in the second scan. Then, the irradiation portion setter 12 determines the remaining points of the area to be inspected R as portions to be irradiated with light in the third scan.

Next, a case where n≥2 and N≥5 will be described. In this case, as illustrated in FIG. 3, the irradiation portion setter 12 defines four first divided regions α at the four corners of the area to be inspected R of $F_n$ rows and $F_n$ columns. Each of the four first divided regions α is $F_{n-1}$ rows and $F_{n-1}$ columns. The points of the $F_{n-1}$ row and the points of the $F_{n-1}$ column are shared by the adjacent first divided regions. Specifically, the four first divided regions α are a region from the first row to the $F_{n-1}$ row and from the first column to the $F_{n-1}$ column, a region from the $F_{n-1}$ row to the N row and from the first column to the $F_{n-1}$ column, a region from the first row to the $F_{n-1}$ row and from the $F_{n-1}$ column to the N column, and a region from the $F_{n-1}$ row to the N row and from the $F_{n-1}$ column to the N column, respectively. In the example illustrated in FIG. 3, the area to be inspected R is a region of $F_3$ rows and $F_3$ columns, and the first divided region α is a region of $F_2$ rows and $F_2$ columns. That is, in the example illustrated in FIG. 3, the first divided region α of 5 rows and 5 columns is defined at the four corners of the area to be inspected R.

The irradiation portion setter 12 determines the point located at the center of each of the first divided regions α as a portion to be irradiated with light in the first scan. For example, in the first divided region α including the reference position, $(F_{n-2}, F_{n-2})$ is determined as an irradiation portion $P_1$ to be irradiated with light in the first scan. In the example illustrated in FIG. 3, the points located at the centers of the respective first divided regions α are (3, 3), (7, 3), (3, 7), and (7, 7). These points are determined as the irradiation portions $P_1$ to be irradiated with light in the first scan.

The irradiation portion setter 12 determines the points located at the four corners of each of the first divided regions α as irradiation portions $P_2$ to be irradiated with light in the second scan. For example, in the first divided region α including the reference position, (1, 1), (1, $F_{n-1}$), ($F_{n-1}$, 1), and ($F_{n-1}$, $F_{n-1}$) are determined as the irradiation portions $P_2$ to be irradiated with light in the second scan. In the example illustrated in FIG. 3, the points located at the four corners of each of the first divided regions α are (1, 1), (5, 1), (9, 1), (1, 5), (5, 5), (9, 5), (1, 9), (5, 9), and (9, 9). These points are determined as the irradiation portions $P_2$ to be irradiated with light in the second scan. When the first divided region α is 3 rows and 3 columns, the irradiation portion setter 12 determines the remaining points of the area to be inspected R as portions to be irradiated with light in the third scan.

Figure 4:
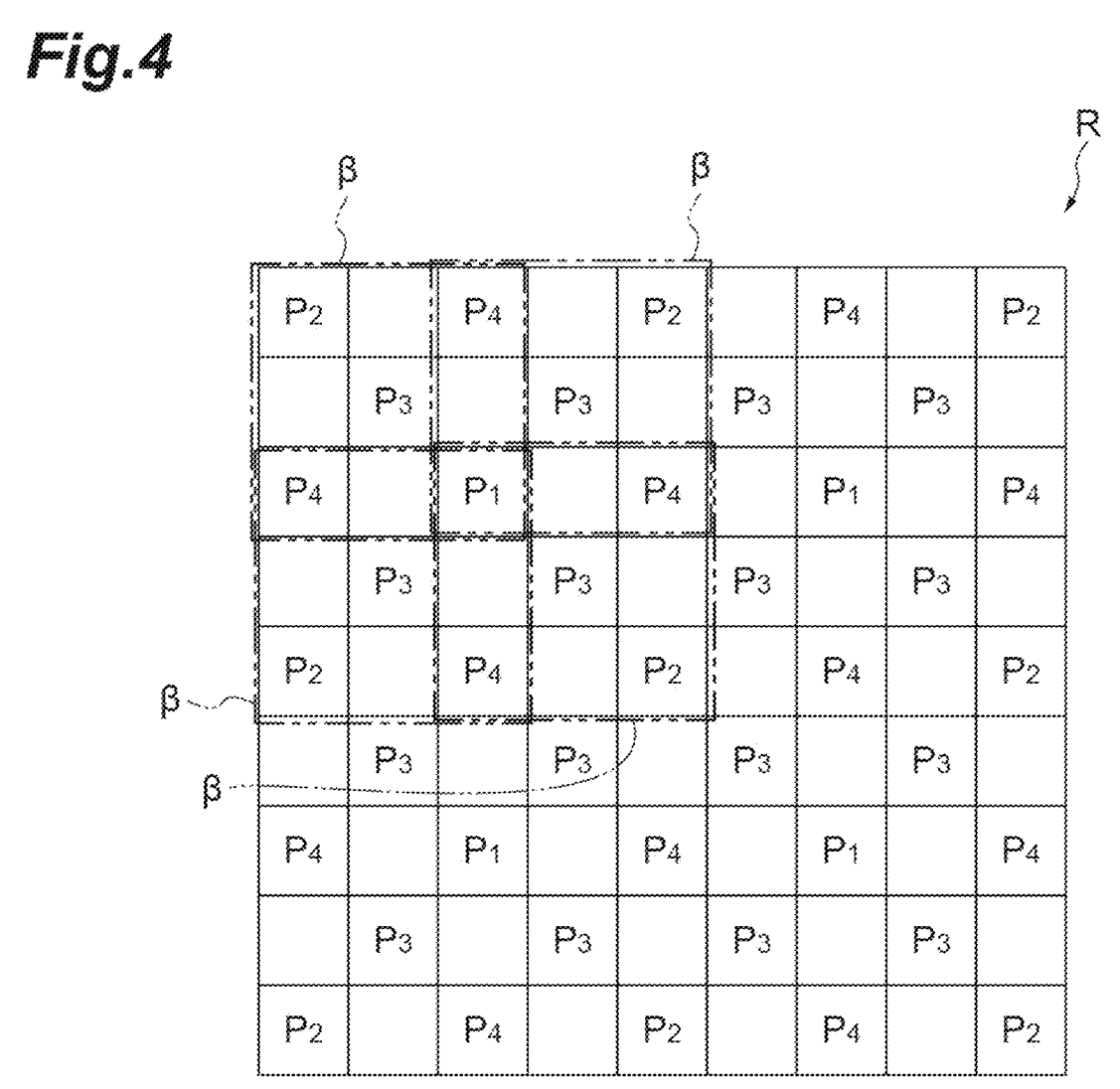

When the first divided region α is larger than 3 rows and 3 columns, as illustrated in FIG. 4, the irradiation portion setter 12 defines four second divided regions β at the four corners of each of the first divided regions α in the same manner as when the first divided region α is defined. Each of the four second divided regions β is $F_{n-2}$ rows and $F_{n-2}$ columns. Since the four divided regions β are defined in each of the four first divided regions α, 16 second divided regions β are defined in the area to be inspected R. In the example illustrated in FIG. 4, the second divided region β is a region of $F_1$ rows and $F_1$ columns. That is, in the example illustrated in FIG. 4, the second divided region β of 3 rows and 3 columns is defined at the four corners of each of the first divided regions α.

The irradiation portion setter 12 determines the point located at the center of each of the second divided regions β as an irradiation portion $P_3$ to be irradiated with light in the third scan in the same manner as when the irradiation portion $P_1$ is determined. For example, in the second divided region β including the reference position, $(F_{n-3}, F_{n-3})$ is determined as the irradiation portion $P_3$ to be irradiated with light in the third scan. In the example illustrated in FIG. 4, the points located at the centers of the respective second divided regions β are (2, 2), (4, 2), (6, 2), (8, 2), (2, 4), (4, 4), (6, 4), (8, 4), (2, 6), (4, 6), (6, 6), (8, 6), (2, 8), (4, 8), (6, 8), and (8, 8). These points are determined as the irradiation portions $P_3$ to be irradiated with light in the third scan.

The irradiation portion setter 12 determines points, which are located at the four corners of each of the second divided regions β and have not yet been determined as portions to be irradiated with light, as irradiation portions $P_4$ to be irradiated with light in the fourth scan. For example, in the second divided region β including the reference position, (1, $F_{n-3}$) and ($F_{n-3}$, 1) are determined as the irradiation portions $P_4$ to be irradiated with light in the fourth scan. In the example illustrated in FIG. 4, (3, 1), (7, 1), (1, 3), (5, 3), (9, 3), (3, 5), (7, 5), (1, 7), (5, 7), (9, 7), (3, 9), and (7, 9) are determined as the irradiation portions $P_4$ to be irradiated with light in the fourth scan. When the second divided region β is 3 rows and 3 columns, the irradiation portion setter 12 determines the remaining points of the area to be inspected R as the irradiation portions $P_4$ to be irradiated with light in the fifth scan.

When the second divided region β is larger than 3 rows and 3 columns, portions to be irradiated with light in the fifth and subsequent scans are determined by the procedure described so far. In other words, four divided regions are defined in a divided region defined immediately before, and portions to be irradiated with light are determined in the order of the point located at the center of each divided region and points located at the four corners of each divided region.

The irradiation portion setter 12 continues the above-described procedure until the smallest divided region becomes 3 rows and 3 columns. When the smallest divided region is 3 rows and 3 columns, the irradiation portion setter 12 determines the remaining points of the area to be inspected R as portions to be irradiated with light in the last scan. The "last scan" does not mean the last scan in each inspection, but means a setting limit as a scan for different irradiation portions. Therefore, in each scan, the last scan may not be performed depending on the determination of the scan determiner 15. After the last scan is performed, a scan for performing inspection irradiation on a portion already irradiated with light may be performed.

Next, the control of the optical system 5 by the irradiation controller 13 of the inspection device 1 according to the present embodiment will be described in detail.

The irradiation controller 13 controls the scanning of the optical system 5 so that inspection irradiation is performed on an irradiation portion set by the irradiation portion setter 12. That is, the optical system 5 performs a scan so that the area to be inspected R is irradiated with light at predetermined intervals corresponding to each scan.

First, the irradiation controller 13 causes the optical system 5 to perform inspection irradiation on an irradiation portion set as a first scan by the irradiation portion setter 12. In the present embodiment, in the first scan, the optical system 5 performs a scan in the range of a part of the area to be inspected R to perform inspection irradiation at predetermined intervals. For example, when the area to be inspected R is divided into portions of N rows and M columns, the optical system 5 performs a scan in a scan range of $n_1$ rows and $m_1$ columns. "$n_1$" is smaller than "N". "$m_1$" is smaller than "M". The interval at which the optical system 5 performs inspection irradiation in the first scan is 1<interval in the row direction≤$m_1$-2 and 1<interval in the column direction≤$n_1$-2.

Figure 3:
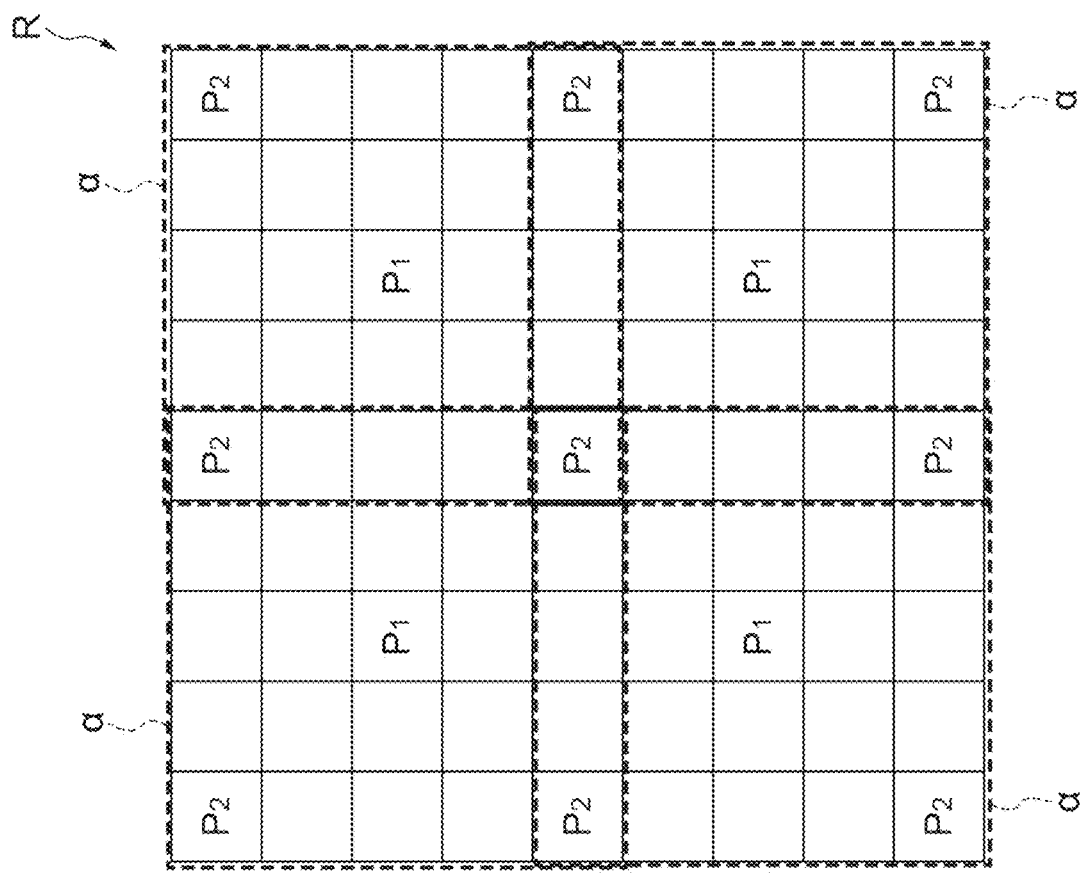
FIG. 3 is a diagram for describing an irradiation portion.

In the examples illustrated in FIGS. 3 and 4, the irradiation controller 13 sets the start position of the first scan to (3, 3), and causes the optical system 5 to scan the scan range of 5 rows and 5 columns. The irradiation controller 13 causes the optical system 5 to irradiate the area to be inspected R with light at intervals of 3 points in the row direction and 3 points in the column direction.

When the scan determiner 15 determines that a second scan is to be performed, the irradiation controller 13 causes the optical system 5 to perform inspection irradiation on an irradiation portion set as the second scan by the irradiation portion setter 12. In the present embodiment, in the second scan, the optical system 5 performs a scan in the entire range of the area to be inspected R to perform inspection irradiation at predetermined intervals. The interval at which the optical system 5 performs inspection irradiation in the second scan is the same as that of the first scan. The interval at which the inspection irradiation is performed may be different between the second scan and the first scan.

In the examples illustrated in FIGS. 3 and 4, the irradiation controller 13 sets the start position of the second scan to (1, 1), and causes the optical system 5 to scan the scan range of 9 rows and 9 columns. The irradiation controller 13 causes the optical system 5 to irradiate the area to be inspected R with light at intervals of 3 points in the row direction and 3 points in the column direction.

When the scan determiner 15 determines that a third scan is to be performed, the irradiation controller 13 causes the optical system 5 to perform inspection irradiation on an irradiation portion set as the third scan by the irradiation portion setter 12. In the present embodiment, in the third scan, the optical system 5 performs a scan in a scan range of $n_2$ rows and $m_2$ columns including the entire scan range in the first scan. "$n_2$" is larger than "$n_1$" and less than "N". "$m_2$" is larger than "$m_1$" and less than "M". The interval at which the optical system 5 performs inspection irradiation in the third scan is smaller than that of the first scan.

In the examples illustrated in FIGS. 3 and 4, the irradiation controller 13 sets the start position of the third scan to (2, 2), and causes the optical system 5 to scan the scan range of 7 rows and 7 columns. The irradiation controller 13 causes the optical system 5 to irradiate the area to be inspected R with light at intervals of 1 point in the row direction and 1 point in the column direction.

When the scan determiner 15 determines that a fourth scan is to be performed, the irradiation controller 13 causes the optical system 5 to perform inspection irradiation on an irradiation portion set as the fourth scan by the irradiation portion setter 12. In the present embodiment, in the fourth scan, the optical system 5 performs a scan in the entire range of the area to be inspected R to perform inspection irradiation at predetermined intervals. The interval at which the optical system 5 performs inspection irradiation in the fourth scan is the same as that of the first scan. However, the position where the inspection irradiation is started in the fourth scan is different from the position where the inspection irradiation is started in the second scan.

In the examples illustrated in FIGS. 3 and 4, the irradiation controller 13 sets the start position of the fourth scan to (1, 1), and causes the optical system 5 to scan the scan range of 9 rows and 9 columns. The position where the inspection irradiation is started in the second scan is (1, 1), whereas the position where the inspection irradiation is started in the fourth scan is (3, 1). The irradiation controller 13 causes the optical system 5 to irradiate the area to be inspected R with light at intervals of 3 points in the row direction and 1 point in the column direction.

As described above, the irradiation controller 13 causes the optical system 5 to perform a plurality of scans according to the determination of the scan determiner 15. When the scan determiner 15 determines that a last scan is to be performed, the irradiation controller 13 causes the optical system 5 to perform inspection irradiation on an irradiation portion set as the last scan by the irradiation portion setter 12. In the present embodiment, in the last scan, the optical system 5 performs a scan in the entire range of the area to be inspected R to perform inspection irradiation on a portion where no inspection irradiation has been performed.

Figure 5:
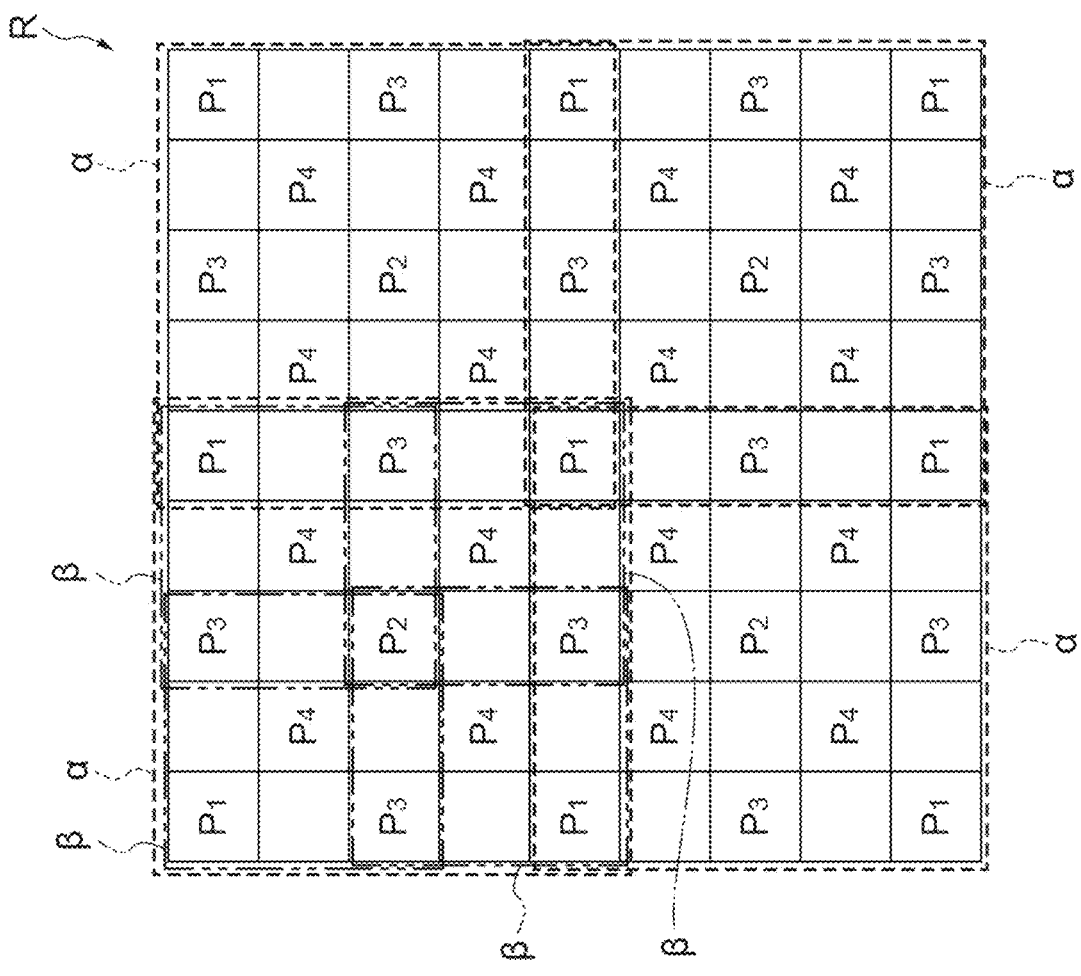
FIG. 5 is a diagram for describing an irradiation portion by a semiconductor device inspection device according to a modification example of the present embodiment.

Next, the control of light irradiation by the irradiation portion setter 12 and the irradiation controller 13 of an inspection device according to a modification example of the present embodiment will be described in more detail with reference to FIG. 5. The modification example illustrated in FIG. 5 is different from the above-described embodiment in that a light scan is performed in the order of the points located at the four corners of the area and the point located at the center of the area. Hereinafter, the differences between the above-described embodiment and the modification example will be mainly described.

The irradiation portion setter 12 determines an irradiation portion for each scan at the start of the inspection of the semiconductor device D. First, the procedure for determining an irradiation portion by the irradiation portion setter 12 in this modification example will be described. In this modification example, the area to be inspected R of the semiconductor device D has a square shape in plan view. Hereinafter, the procedure for determining an irradiation portion in this modification example will be described. In FIG. 5, as in FIG. 3, "N" is $F_3$=9, and the area to be inspected R is divided into 9 rows and 9 columns.

First, a case where n=1 and N=3 will be described. In this case, the area to be inspected R is 3 rows and 3 columns. In this case, the irradiation portion setter 12 determines the points located at the four corners of the area to be inspected R as portions to be irradiated with light in the first scan. Specifically, the irradiation portion setter 12 determines (1, 1), (1, 3), (3, 1), and (3, 3) as portions to be irradiated with light in the first scan. Then, the irradiation portion setter 12 determines the point located at the center of the area to be inspected R as a portion to be irradiated with light in the second scan. Specifically, the irradiation portion setter 12 determines (2, 2) as a portion to be irradiated with light in the second scan. Then, the irradiation portion setter 12 determines remaining points of the area to be inspected R as portions to be irradiated with light in the third scan.

Next, a case where n≥2 and N≥5 will be described. In this case, the irradiation portion setter 12 defines four first divided regions α, each of which has $F_{n-1}$ rows and $F_{n-1}$ columns, at the four corners of the area to be inspected R of $F_n$ rows and $F_n$ columns. In the example illustrated in FIG. 5, the area to be inspected R is a region of $F_3$ rows and $F_3$ columns, and the first divided region α is a region of $F_2$ rows and $F_2$ columns. That is, in the example illustrated in FIG. 5, the first divided region α of 5 rows and 5 columns is defined at the four corners of the area to be inspected R.

The irradiation portion setter 12 determines the points located at the four corners of each of the first divided regions α as the irradiation portions $P_1$ to be irradiated with light in the first scan. For example, in the first divided region α including the reference position, (1, 1), (1, $F_{n-1}$), ($F_{n-1}$, 1), and ($F_{n-1}$, $F_{n-1}$) are determined as the irradiation portions $P_1$ to be irradiated with light in the first scan. In the example illustrated in FIG. 5, the points located at the four corners of each of the first divided regions α are (1, 1), (5, 1), (9, 1), (1, 5), (5, 5), (9, 5), (1, 9), (5, 9), and (9, 9). These points are determined as the irradiation portions Pi to be irradiated with light in the first scan.

The irradiation portion setter 12 determines the point located at the center of each of the first divided regions α as the irradiation portion $P_2$ to be irradiated with light in the second scan. For example, in the first divided region α including the reference position, $(F_{n-2}, F_{n-2})$ is determined as the irradiation portion $P_2$ to be irradiated with light in the second scan. In the example illustrated in FIG. 5, the points located at the centers of the respective first divided regions α are (3, 3), (7, 3), (3, 7), and (7, 7). These points are determined as the irradiation portions $P_2$ to be irradiated with light in the second scan. When the first divided region α is 3 rows and 3 columns, the irradiation portion setter 12 determines the remaining points of the area to be inspected R as portions to be irradiated with light in the third scan.

When the first divided region α is larger than 3 rows and 3 columns, the irradiation portion setter 12 defines four second divided regions β, each of which has $F_{n-2}$ rows and $F_{n-2}$ columns, at the four corners of each of the first divided regions α in the same manner as when the first divided region α is defined. That is, 16 second divided regions β are defined in the area to be inspected R. In the example illustrated in FIG. 5, the second divided region β is a region of $F_1$ rows and $F_1$ columns. That is, in the example illustrated in FIG. 5, the second divided region β of 3 rows and 3 columns is defined at the four corners of each of the first divided regions α.

The irradiation portion setter 12 determines points, which are located at the four corners of each of the second divided regions β and have not yet been determined as portions to be irradiated with light, as the irradiation portions $P_3$ to be irradiated with light in the third scan. For example, in the second divided region β including the reference position, (1, $F_{n-3}$) and ($F_{n-3}$, 1) are determined as the irradiation portions $P_3$ to be irradiated with light in the third scan. In the example illustrated in FIG. 5, the points that are located at the four corners of each of the second divided regions β and have not yet been determined as portions to be irradiated with light are (3, 1), (7, 1), (1, 3), (5, 3), (9, 3), (3, 5), (7, 5), (1, 7), (5, 7), (5, 9), (9, 3), and (9, 7). These points are determined as the irradiation portions $P_3$ to be irradiated with light in the third scan.

The irradiation portion setter 12 determines the point located at the center of each of the second divided regions β as the irradiation portion $P_4$ to be irradiated with light in the fourth scan in the same manner as when the irradiation portion $P_1$ is determined. For example, in the second divided region β including the reference position, $(F_{n-3}, F_{n-3})$ is determined as the irradiation portion $P_4$ to be irradiated with light in the fourth scan. In the example illustrated in FIG. 5, the points located at the centers of the respective second divided regions β are (2, 2), (4, 2), (6, 2), (8, 2), (2, 4), (4, 4), (6, 4), (8, 4), (2, 6), (4, 6), (6, 6), (8, 6), (2, 8), (4, 8), (6, 8), and (8, 8). These points are determined as the irradiation portions $P_4$ to be irradiated with light in the fourth scan. When the second divided region β is 3 rows and 3 columns, the irradiation portion setter 12 determines the remaining points of the area to be inspected R as the irradiation portions $P_4$ to be irradiated with light in the fifth scan.

When the second divided region β is larger than 3 rows and 3 columns, portions to be irradiated with light in the fifth and subsequent scans are determined by the procedure described so far. In other words, four divided regions are defined in a divided region defined immediately before, and portions to be scanned with light are determined in the order of the points located at the four corners of each area and the point located at the center of each area.

The irradiation portion setter 12 continues the above-described procedure until the smallest divided region becomes 3 rows and 3 columns. When the smallest divided region is 3 rows and 3 columns, the irradiation portion setter 12 determines the remaining points of the area to be inspected R as portions to be irradiated with light in the last scan.

Next, the control of the optical system 5 by the irradiation controller 13 of the inspection device 1 according to this modification example will be described in detail.

The irradiation controller 13 controls the scanning of the optical system 5 so that inspection irradiation is performed on an irradiation portion set by the irradiation portion setter 12. That is, the optical system 5 performs a scan so that the area to be inspected R is irradiated with light at predetermined intervals corresponding to each scan.

First, the irradiation controller 13 causes the optical system 5 to perform inspection irradiation on an irradiation portion set as a first scan by the irradiation portion setter 12. In the present embodiment, in the first scan, the optical system 5 performs a scan in the entire range of the area to be inspected R to perform inspection irradiation at predetermined intervals. The interval at which the optical system 5 performs inspection irradiation in the first scan is the same as the interval at which the optical system 5 performs inspection irradiation in the second scan when the second scan is performed. The interval at which the inspection irradiation is performed may be different between the second scan and the first scan.

In the example illustrated in FIG. 5, the irradiation controller 13 sets the start position of the first scan to (1, 1), and causes the optical system 5 to scan the scan range of 9 rows and 9 columns. The irradiation controller 13 causes the optical system 5 to irradiate the area to be inspected R with light at intervals of 3 points in the row direction and 3 points in the column direction.

When the scan determiner 15 determines that a second scan is to be performed, the irradiation controller 13 causes the optical system 5 to perform inspection irradiation on an irradiation portion set as the second scan by the irradiation portion setter 12. In this modification example, in the second scan, the optical system 5 performs a scan in the range of a part of the area to be inspected R to perform inspection irradiation at predetermined intervals. For example, when the area to be inspected R is divided into portions of N rows and M columns, the optical system 5 performs a scan in a scan range of $n_1$ rows and $m_1$ columns. "$n_1$" is smaller than "N". "$m_1$" is smaller than "M". The interval at which the optical system 5 performs inspection irradiation in the second scan is 1<interval in the row direction≤$m_1$-2 and 1<interval in the column direction≤$n_1$-2.

In the example illustrated in FIG. 5, the irradiation controller 13 sets the start position of the second scan to (3, 3), and causes the optical system 5 to scan the scan range of 5 rows and 5 columns. The irradiation controller 13 causes the optical system 5 to irradiate the area to be inspected R with light at intervals of 3 points in the row direction and 3 points in the column direction.

When the scan determiner 15 determines that a third scan is to be performed, the irradiation controller 13 causes the optical system 5 to perform inspection irradiation on an irradiation portion set as the third scan by the irradiation portion setter 12. In the present embodiment, in the third scan, the optical system 5 performs a scan in the entire range of the area to be inspected R to perform inspection irradiation at predetermined intervals. The interval at which the optical system 5 performs inspection irradiation in the third scan is the same as that of the first scan. However, the position where the inspection irradiation is started in the third scan is different from the position where the inspection irradiation is started in the first scan.

In the example illustrated in FIG. 5, the irradiation controller 13 sets the start position of the third scan to (1, 1), and causes the optical system 5 to scan the scan range of 9 rows and 9 columns. The position where the inspection irradiation is started in the first scan is (1, 1), whereas the position where the inspection irradiation is started in the fourth scan is (3, 1). The irradiation controller 13 causes the optical system 5 to irradiate the area to be inspected R with light at intervals of 3 points in the row direction and 1 point in the column direction.

When the scan determiner 15 determines that a fourth scan is to be performed, the irradiation controller 13 causes the optical system 5 to perform inspection irradiation on an irradiation portion set as the fourth scan by the irradiation portion setter 12. In the present embodiment, in the fourth scan, the optical system 5 performs a scan in a scan range of $n_2$ rows and $m_2$ columns including the entire scan range in the second scan. "$n_2$" is larger than $n_1$ and less than "N". "$m_2$" is larger than "$m_1$" and less than "M". The interval at which the optical system 5 performs inspection irradiation in the fourth scan is smaller than that of the first scan.

In the example illustrated in FIG. 5, the irradiation controller 13 sets the start position of the fourth scan to (2, 2), and causes the optical system 5 to scan the scan range of 7 rows and 7 columns. The irradiation controller 13 causes the optical system 5 to irradiate the area to be inspected R with light at intervals of 1 point in the row direction and 1 point in the column direction.

As described above, the irradiation controller 13 causes the optical system 5 to perform a plurality of scans according to the determination of the scan determiner 15. When the scan determiner 15 determines that a last scan is to be performed, the irradiation controller 13 causes the optical system 5 to perform inspection irradiation on an irradiation portion set as the last scan by the irradiation portion setter 12. In this modification example, in the last scan, the optical system 5 performs a scan in the entire range of the area to be inspected R to perform inspection irradiation on a portion where no inspection irradiation has been performed.

Figure 6:
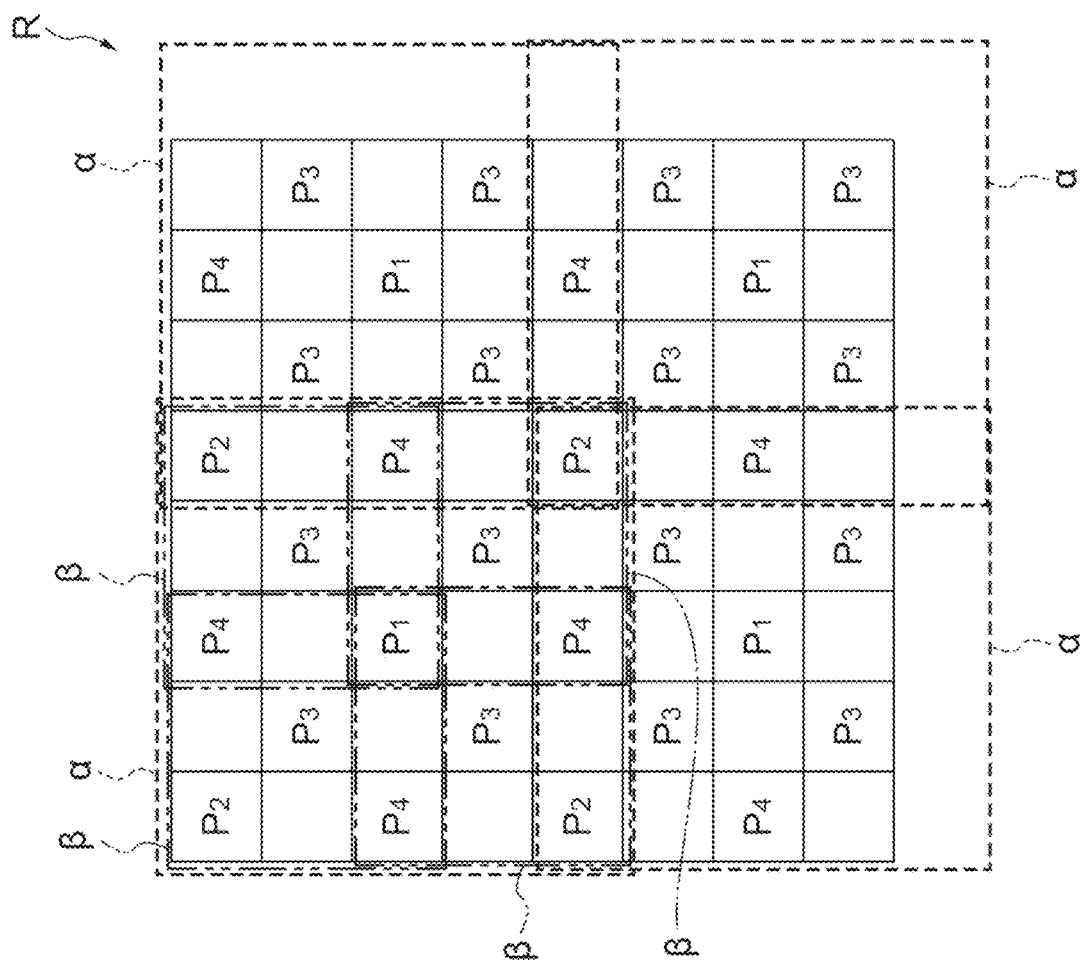
FIG. 6 is a diagram illustrating an irradiation portion by a semiconductor device inspection device according to a modification example of the present embodiment.

Next, a procedure for determining an irradiation portion by the irradiation portion setter 12 of an inspection device according to a modification example of the present embodiment will be described with reference to FIG. 6. The modification example illustrated in FIG. 6 is different from the above-described embodiment in that the irradiation portion setter 12 divides the area to be inspected R into portions of even-numbered columns and even-numbered rows. Hereinafter, the differences between the above-described embodiment and the modification example will be mainly described.

The irradiation portion setter 12 divides the area to be inspected R of the semiconductor device D into portions of M rows and M columns. Hereinafter, each portion will be referred to as a point. That is, the irradiation portion setter 12 divides the area to be inspected R into M×M points of (1, 1) to (M, M). The irradiation portion setter 12 sets the position (1, 1) as a reference position. "M" is a value satisfying "2m" when "m" is a natural number of 2 or more. In the example illustrated in FIG. 6, m=4, and the area to be inspected R is divided into portions of 8 rows and 8 columns.

In this case, the irradiation portion setter 12 defines four first divided regions α in the area to be inspected R of M rows and M columns. In this modification example, when $F_{n-1} < M < F_n$ is satisfied, the first divided region of $F_{n-1}$ rows and $F_{n-1}$ columns is defined from the reference position. In the example illustrated in FIG. 6, each of the first divided regions α is $F_2$ rows and $F_2$ columns, that is, 5 rows and 5 columns. The points of the $F_{n-1}$ row and the points of the $F_{n-1}$ column are shared by the adjacent first divided regions. Other than the first divided region α including the reference position, a region excluded from the area to be inspected R is included. Therefore, the four first divided regions α in the area to be inspected R are a region from the first row to the $F_{n-1}$ row and from the first column to the $F_{n-1}$ column, a region from the $F_{n-1}$ row to the M row and from the first column to the $F_{n-1}$ column, a region from the first row to the $F_{n-1}$ row and from the $F_{n-1}$ column to the M column, and a region from the $F_{n-1}$ row to the M row and from the $F_{n-1}$ column to the M column, respectively.

The irradiation portion setter 12 determines the point located at the center of each of the first divided regions α as a portion to be irradiated with light in the first scan. In the example illustrated in FIG. 6, the points located at the centers of the respective first divided regions α are (3, 3), (7, 3), (3, 7), and (7, 7). These points are determined as the irradiation portions $P_1$ to be irradiated with light in the first scan.

The irradiation portion setter 12 determines the points located at the four corners of each of the first divided regions α as the irradiation portions $P_2$ to be irradiated with light in the second scan. In the example illustrated in FIG. 6, the points located at the four corners of the first divided region α including the reference position are (1, 1), (5, 1), (1, 5), and (5, 5). These points are determined as the irradiation portions $P_2$ to be irradiated with light in the second scan. When the first divided region α is 3 rows and 3 columns, the irradiation portion setter 12 determines the remaining points of the area to be inspected R as the irradiation portions $P_3$ to be irradiated with light in the third scan.

When the first divided region α is larger than 3 rows and 3 columns, portions to be irradiated with light in the third and subsequent scans are determined by the procedure described in the embodiment. In other words, four divided regions are defined in a divided region defined immediately before, and portions to be irradiated with light are determined in the order of the point located at the center of each divided region and the points located at the four corners of each divided region. The irradiation portion setter 12 continues the above-described procedure until the smallest divided region becomes 3 rows and 3 columns. When the smallest divided region is 3 rows and 3 columns, the irradiation portion setter 12 determines the remaining points of the area to be inspected R as portions to be irradiated with light in the last scan. In this modification example, after the first divided region α is determined, an irradiation portion for each scan may be determined by the procedure described with reference to FIG. 5.

Figure 7:
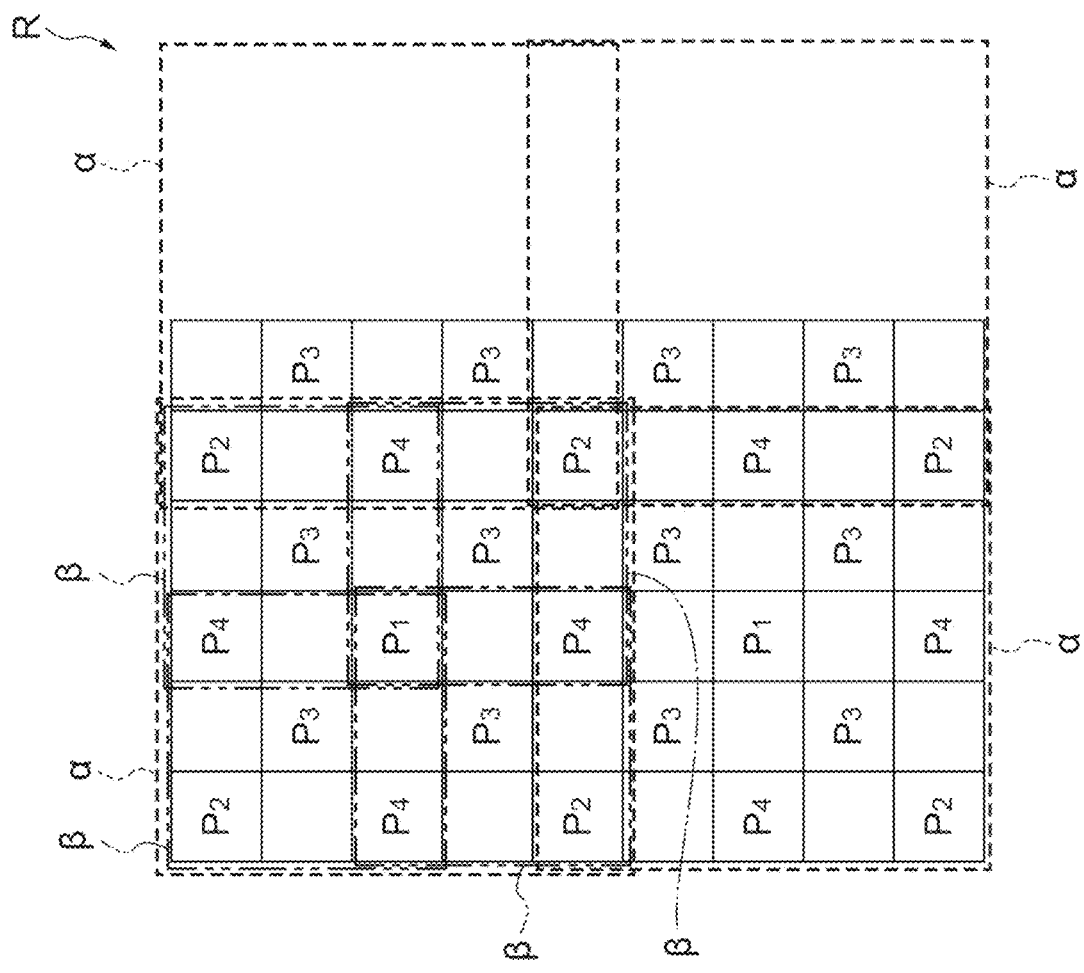
FIG. 7 is a diagram illustrating an irradiation portion by a semiconductor device inspection device according to a modification example of the present embodiment.

Next, a procedure for determining an irradiation portion by the irradiation portion setter 12 of an inspection device according to a modification example of the present embodiment will be described with reference to FIG. 7. The modification example illustrated in FIG. 7 is different from the above-described embodiment in that the area to be inspected R is rectangular. Hereinafter, the differences between the above-described embodiment and the modification example will be mainly described.

The irradiation portion setter 12 divides the area to be inspected R of the semiconductor device D into portions of N rows and M columns. Hereinafter, each portion will be referred to as a point. That is, the irradiation portion setter 12 divides the area to be inspected R into N×M points of (1, 1) to (N, M). The irradiation portion setter 12 sets the position (1, 1) as a reference position. In the example illustrated in FIG. 7, the area to be inspected R is divided into portion of 9 rows and 6 columns.

In this case, the irradiation portion setter 12 defines the first divided region α based on the larger one of the number of rows N and the number of columns M. For example, as in the example illustrated in FIG. 7, when the number of rows N is larger than the number of columns M, the first divided region of $F_{n-1}$ rows and $F_{n-1}$ columns is defined from the reference position when $F_{n-1}<N<F_n$ is satisfied. In the example illustrated in FIG. 7, each of the first divided regions α is $F_2$ rows and $F_2$ columns, that is, 5 rows and 5 columns. The points of the $F_{n-1}$ row and the points of the $F_{n-1}$ column are shared by the adjacent first divided regions. Other than the first divided region α including the reference position, a region excluded from the area to be inspected R is included. Therefore, the respective first divided regions α in the area to be inspected R are a region from the first row to the $F_{n-1}$ row and from the first column to the $F_{n-1}$ column, a region from the $F_{n-1}$ row to the M row and from the first column to the $F_{n-1}$ column, a region from the first row to the $F_{n-1}$ row and from the $F_{n-1}$ column to the M column, and a region from the $F_{n-1}$ row to the M row and from the $F_{n-1}$ column to the M column.

The irradiation portion setter 12 determines the point located at the center of each of the first divided regions α as a portion to be irradiated with light in the first scan. For example, in the first divided region α including the reference position, $(F_{n-2}, F_{n-2})$ is determined as an irradiation portion a to be irradiated with light in the first scan. In the example illustrated in FIG. 7, the points located at the centers of the respective first divided regions α are (3, 3) and (3, 7). These points are determined as the irradiation portions Pi to be irradiated with light in the first scan.

The irradiation portion setter 12 determines the points located at the four corners of each of the first divided regions α as the irradiation portions $P_2$ to be irradiated with light in the second scan. In the example illustrated in FIG. 7, the points located at the four corners of the first divided region α including the reference position are (1, 1), (5, 1), (1, 5), (5, 5), (1, 9), and (5, 9). These points are determined as the irradiation portions $P_2$ to be irradiated with light in the second scan. When the first divided region α is 3 rows and 3 columns, the irradiation portion setter 12 determines the remaining points of the area to be inspected R as the irradiation portions $P_3$ to be irradiated with light in the third scan.

When the first divided region α is larger than 3 rows and 3 columns, portions to be irradiated with light in the third and subsequent scans are determined by the procedure described in the embodiment. In other words, four divided regions are defined in a divided region defined immediately before, and portions to be irradiated with light are determined in the order of the point located at the center of each divided region and the points located at the four corners of each divided region. The irradiation portion setter 12 continues the above-described procedure until the smallest divided region becomes 3 rows and 3 columns. When the smallest divided region is 3 rows and 3 columns, the irradiation portion setter 12 determines the remaining points of the area to be inspected R as portions to be irradiated with light in the last scan. In this modification example, after the first divided region α is determined, an irradiation portion for each scan may be determined by the procedure described with reference to FIG. 5.

Next, the function and effect of the semiconductor device inspection method and the inspection device 1 according to the present embodiment and the modification example will be described in detail.

Figure 8:
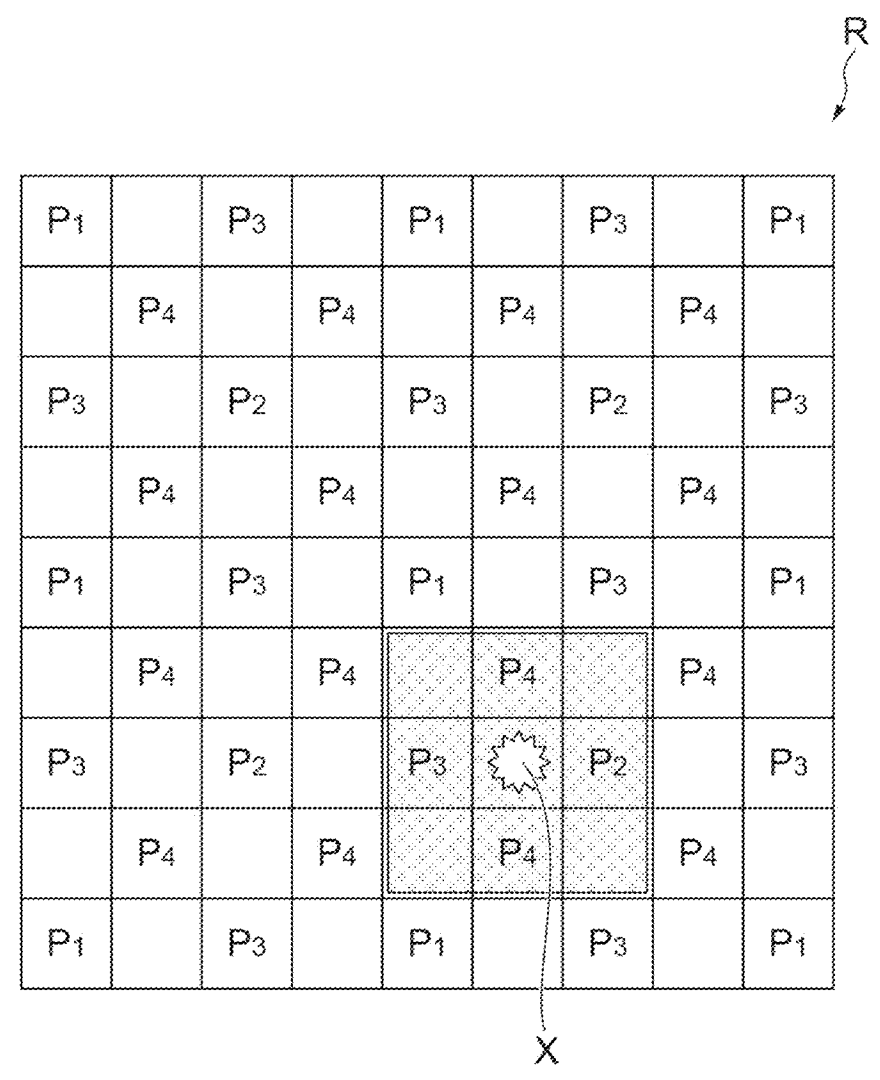

As an example, a case where an irradiation portion in each scan is determined by the procedure described with reference to FIGS. 3 and 4 will be examined. FIG. 8 illustrates that a defective portion is located at (6, 7) of the area to be inspected R and eight points around the defective portion are within a range in which the defective portion can be detected. In this case, when inspection irradiation is performed by raster scan one point at a time from (1, 1), the inspection irradiation should be performed at 50 points before a defective portion X is detected. On the other hand, if the interval of light irradiation is simply increased to inspect only the irradiation portion $P_1$ by inspection irradiation, the defective portion X is not detected.

However, according to the semiconductor device inspection method and the semiconductor device inspection device according to the present embodiment and the modification example, even if the defective portion X is not detected in the inspection based on the inspection irradiation on the irradiation portion $P_1$ by previous scan, the defective portion X is detected in the inspection based on the inspection irradiation on the irradiation portion $P_2$ by subsequent scan. Hereinafter, the process of performing the previous scan is referred to as a "first irradiation step", and the process of performing the subsequent scan is referred to as a "second irradiation step". In this case, the defective portion X is detected by the inspection irradiation at 13 points.

In the semiconductor device inspection method according to the present embodiment and the modification example, in the first irradiation step, inspection irradiation is performed on at least one portion in the area to be inspected R. Based on the output signal that is output from the semiconductor device D during the first irradiation step, information indicating the presence or absence of a defective portion in the entire area to be inspected R is output. Hereinafter, this process is referred to as a "first output step", and the information indicating the presence or absence of a defective portion in the entire area to be inspected R based on the output signal output from the semiconductor device D during the first irradiation step is referred to as "first information".

In the second irradiation step, the inspection irradiation is performed on a portion in the area to be inspected R, which is different from the portion where the inspection irradiation has been performed in the first irradiation step. Based on the output signal that is output from the semiconductor device D during the second irradiation step, information indicating the presence or absence of a defective portion in the entire area to be inspected R is output. Hereinafter, this process is referred to as a "second output step", and the information indicating the presence or absence of a defective portion in the entire area to be inspected R based on the output signal output from the semiconductor device D during the second irradiation step is referred to as "second information". Therefore, even if the information of a defective portion is missing in the output of the measurement result based on the first irradiation step, the defective portion is detected by the output of the measurement result based on the second irradiation step. In this case, the accuracy of the inspection is ensured regardless of the position of the irradiation portion in the first irradiation step.

In this inspection method, it is determined whether or not to perform the second irradiation step based on the first information. Therefore, when a defective portion is detected according to the inspection based on the output of the first output step, the number of irradiation portions to be irradiated with light until the defective portion is detected is reduced. In this case, the time required for inspection is significantly reduced. That is, in the semiconductor device inspection method described above, the time required for inspection can be easily shortened while ensuring the accuracy of the inspection. That is, in the semiconductor device inspection method described above, the time required for inspection can be easily shortened while ensuring the accuracy of the inspection.

In the semiconductor device inspection method, based on the output signal that is output from the semiconductor device D during the first irradiation step, a two-dimensional image of the area to be inspected R indicating the presence or absence of a defective portion in the entire area to be inspected is generated. In this case, since a two-dimensional image indicating whether or not a defective portion is present is generated based on the output signal during the first irradiation step, the user can easily determine whether or not to perform the second irradiation step by viewing the image.

In the first irradiation step, a first scan is performed in the area to be inspected R, and inspection irradiation is performed in the first scan. In the second irradiation step, a second scan of which the scan range overlaps that of the first scan is performed in the area to be inspected, and inspection irradiation is performed in the second scan. In this case, since the scan ranges of the first irradiation step and the second irradiation step overlap each other, the accuracy of the inspection is more easily ensured.

As illustrated in FIGS. 3 to 7, one of the portions where the inspection irradiation is performed in one of the first irradiation step or the second irradiation step is located within a region of which diagonal or diameter is a line segment passing through two of the portions where the inspection irradiation is performed in the other one of the first irradiation step or the second irradiation step. For example, in FIG. 3, the irradiation portion (3, 3) in the first scan is located within a region of which diagonal line or diameter is a line segment passing through the irradiation portions (1, 1) and (5, 1) in the second scan. It is difficult to grasp a detectable range from the position irradiated with light. However, according to this inspection method, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed. For this reason, if the overlap between the ranges where a defective portion can be detected is suppressed, the time required for inspection can be further shortened.

As illustrated in FIGS. 3 to 7, one of the portions where the inspection irradiation is performed in one of the first irradiation step or the second irradiation step is located between two of the portions where the inspection irradiation is performed in the other one of the first irradiation step or the second irradiation step. For example, in FIG. 3, the irradiation portion (3, 3) in the first scan is located between the irradiation portions (1, 1) and (5, 1) in the second scan.

In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

As illustrated in FIGS. 3 to 7, at least two of the portions where the inspection irradiation is performed in one of the first irradiation step or the second irradiation step are located equidistant from one of the portions where the inspection irradiation is performed in the other one of the first irradiation step or the second irradiation step. For example, in FIG. 3, the irradiation portions (1, 1), (5, 1), (1, 5), and (5, 5) in the second scan are located equidistant from the irradiation portion (3, 3) in the first scan. In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

As illustrated in FIGS. 3 to 7, the number of portions where the inspection irradiation is performed in the first irradiation step is smaller than the number of portions where the inspection irradiation is performed in the second irradiation step. For example, in FIG. 3, the number of portions where the inspection irradiation is performed in the first scan is smaller than the number of portions where the inspection irradiation is performed in the second scan. In FIG. 5, the number of portions where the inspection irradiation is performed in the second scan is smaller than the number of portions where the inspection irradiation is performed in the third scan. According to this inspection method, when the range in which a defective portion can be detected in the first output step and the range in which a defective portion can be detected in the second output step overlap each other, the time required for inspection can be further shortened.

As illustrated in FIGS. 3 to 7, a portion where the inspection irradiation is performed in one of the first irradiation step or the second irradiation step is located in each of a plurality of regions obtained by dividing the area to be inspected R of the semiconductor device D into four parts by a straight line passing through at least one of the portions where the inspection irradiation is performed in the other one of the first irradiation step or the second irradiation step. For example, in FIG. 3, when the area to be inspected R is divided into four parts by the vertical line and the horizontal line passing through the irradiation portion (3, 3) in the first scan, the irradiation portions (1, 1), (5, 1), (1, 5), (5, 5), and the like in the second scan are located in the respective divided regions. In this case, a portion irradiated with light in the first irradiation step and a portion irradiated with light in the second irradiation step are arranged in a well-balanced manner. Therefore, the overlap between a range in which a defective portion can be detected in the first output step and a range in which a defective portion can be detected in the second output step is suppressed.

As illustrated in FIGS. 3 to 7, a plurality of portions where the inspection irradiation is performed in at least one of the first irradiation step or the second irradiation step are located at equal intervals from each other. For example, in FIG. 3, the irradiation portions (3, 3), (7, 3), (3, 7), and (7, 7) in the first scan are located at equal intervals from each other. In this case, portions irradiated with light in at least one of the first irradiation step or the second irradiation step are arranged in a well-balanced manner. Therefore, the overlap between the ranges where a defective portion can be detected is suppressed.

In the semiconductor device inspection method, when it is determined that the inspection irradiation is to be further performed based on the second information, the inspection irradiation is further performed on at least one portion in the area to be inspected, which is different from the portion where the inspection irradiation has been performed in the first irradiation step and the second irradiation step, in the semiconductor device to which the test signal is being input. Hereinafter, this process is referred to as a "third irradiation step". Based on the output signal that is output from the semiconductor device during the third irradiation step, information indicating the presence or absence of a defective portion in the entire area to be inspected is output. Hereinafter, this process is referred to as a "third output step", and the information indicating the presence or absence of a defective portion in the entire area to be inspected based on the output signal output from the semiconductor device during the third irradiation step is referred to as "third information". As illustrated in FIGS. 3, 4, 6, and 7, at least one of the portions where the inspection irradiation is performed in the third irradiation step is located between one of the portions where the inspection irradiation is performed in the first irradiation step and one of the portions where the inspection irradiation is performed in the second irradiation step. For example, in FIG. 3, the irradiation portion (2, 2) in the third scan is located between the irradiation portion (3, 3) in the first scan and the irradiation portion (1, 1) in the second scan.

In this case, the irradiation step and the output step are divided into at least three stages. Therefore, if a defective portion is detected in the inspection based on the first output step or the second output step, the time required for inspection is shortened. In the third irradiation step, the inspection irradiation is performed on an irradiation portion in the area to be inspected R, which is different from the portion where the inspection irradiation has been performed in the first irradiation step and the second irradiation step. Therefore, even if the information of a defective portion is missing in the first information based on the first irradiation step and the second information based on the second irradiation step, the defective portion can be detected by the third information based on the third irradiation step. In this case, the accuracy of the inspection is ensured regardless of the position of the irradiation portion in the first irradiation step and the second irradiation step. At least one of the portions irradiated with light in the third irradiation step is located between one of the portions irradiated with light in the first irradiation step and one of the portions irradiated with light in the second irradiation step. Therefore, the ranges in which a defective portion can be detected in the first output step, the second output step, and the third output step are difficult to overlap each other.

In the inspection device 1, the irradiation portion setter 12 sets at least one portion in the area to be inspected R as an irradiation portion where the inspection irradiation is to be performed by the optical system 5. The irradiation controller 13 controls the optical system 5 to perform the inspection irradiation on the irradiation portion set by the irradiation portion setter 12 in the semiconductor device D to which the test signal is being input. When the scan determiner 15 determines that the inspection irradiation is to be further performed, the irradiation portion setter 12 newly sets at least one portion in the area to be inspected R, which is different from the portion already set as an irradiation portion and irradiated with light, as an irradiation portion. Therefore, even if the information of a defective portion is missing in the output from the analyzer 14 based on the previous inspection irradiation, the defective portion is detected by the output from the analyzer 14 based on the subsequent inspection irradiation. In this case, the accuracy of the inspection is ensured regardless of the position of the irradiation portion in the previous inspection irradiation.

In the inspection device 1, information indicating the presence or absence of a defective portion in the entire area to be inspected is output from the analyzer 14, and after the information is output, whether or not to further perform the inspection irradiation on the area to be inspected R by the optical system 5 is determined. Therefore, when a defective portion is detected according to the inspection based on the previous inspection irradiation, the number of irradiation portions to be irradiated with light until the defective portion is detected is reduced. As a result, the time required for inspection can be significantly shortened. That is, in the inspection device 1, the time required for inspection can be easily shortened while ensuring the accuracy of the inspection.

The analyzer 14 generates a two-dimensional image of the area to be inspected R, which indicates the presence or absence of a defective portion in the entire area to be inspected R, based on the output signal that is output from the semiconductor device D while the optical system 5 is performing inspection irradiation on the irradiation portion set by the irradiation portion setter 12, and outputs the generated image as information indicating the presence or absence of a defective portion in the entire area to be inspected R. In this case, since a two-dimensional image indicating whether or not a defective portion is present is generated, the user can easily determine whether or not to further perform the inspection irradiation by viewing the image.

The irradiation controller 13 causes the optical system 5 to scan the area to be inspected R so that the inspection irradiation is performed on the irradiation portion set by the irradiation portion setter 12 in the scan. When the scan determiner 15 determines that the inspection irradiation is to be further performed, the irradiation controller 13 controls the optical system 5 to scan a range overlapping the range having already been scanned, so that the inspection irradiation is performed on the newly set irradiation portion in the scan. In this case, since the scan ranges of the previous scan and the subsequent scan overlap each other, the accuracy of the inspection is more easily ensured.

While the embodiment of the present invention and the modification examples have been described above, the present invention is not necessarily limited to the embodiment and the modification examples described above, and various changes can be made without departing from the scope of the present invention.

For example, the irradiation portion setter 12 may use the determined irradiation portion for inspection of a plurality of semiconductor devices D without determining an irradiation portion for each inspection of the semiconductor device D. The irradiation portion setter 12 may determine, for each scan, an irradiation portion in the scan. The irradiation portion for each scan stored in advance in the information administrator 11 may be input by the user or an external device.

In the present embodiment and the modification example, the optical system 5 performs a raster scan, but the present invention is not limited thereto. In each scan, any scan may be performed as long as the irradiation portion set by the irradiation portion setter 12 is irradiated with light.

In the present embodiment and the modification examples, the scan range is changed according to the irradiation portion of each scan, but the present invention is not limited thereto. For example, inspection irradiation may be performed on the irradiation portion set for each scan while scanning the same range in all scans.

In the present embodiment and the modification examples, the measurement image is generated after one scan for the area to be inspected R is ended. However, measurement images may be sequentially generated based on the result signal already obtained during the scan. Also in this case, the scan determiner 15 determines whether or not to further perform a scan after the measurement result corresponding to one scan for the area to be inspected R, that is, information indicating the presence or absence of a defective portion in the entire area to be inspected R, is output from the analyzer 14.

REFERENCE SIGNS LIST

1: semiconductor device inspection device, 5: optical system, 12: irradiation portion setter, 13: irradiation controller, 14: analyzer, 15: scan determiner, D: semiconductor device, R: area to be inspected.

The invention claimed is:

1. A semiconductor device inspection method, comprising:
    performing a first inspection irradiation on at least one portion in an area to be inspected of the semiconductor device to which a test signal is being input, the first inspection irradiation being for irradiating the area to be inspected with light while the test signal is being input to the semiconductor device;
    outputting first information indicating presence or absence of a defective portion in an entire of the area to be inspected, based on an output signal electrically output from the semiconductor device during performing the first inspection irradiation;
    determining, based on the first information, whether or not to perform a second inspection irradiation on the area to be inspected, the second inspection irradiation being for irradiating the area to be inspected with light while the test signal is being input to the semiconductor device;
    when it is determined that the second inspection irradiation is to be performed, performing the second inspection irradiation on at least one portion in the area to be inspected of the semiconductor device to which the test signal is being input, the at least one portion where the second inspection irradiation is to be performed being different from the at least one portion where the first inspection irradiation has been performed;
    wherein a portion where one of the first inspection irradiation or the second inspection irradiation is performed is located in each of a plurality of regions obtained by equally dividing the area to be inspected of the semiconductor device into four equal parts by a straight line passing through at least one of portions where the other one of the first inspection irradiation or the second inspection irradiation is performed, wherein a center of each of the plurality of regions defines a portion to be irradiated in the first inspection irradiation;
    outputting second information indicating presence or absence of a defective portion in the entire of the area to be inspected, based on an output signal output from the semiconductor device during performing the second inspection irradiation; and
    inspecting the semiconductor device, based on the first information and the second information.

2. The semiconductor device inspection method according to claim 1, further comprising:
    generating a two-dimensional image of the area to be inspected indicating presence or absence of a defective portion in the entire of the area to be inspected, based on the output signal output from the semiconductor device during performing the first inspection irradiation.

3. The semiconductor device inspection method according to claim 1,
    wherein the first inspection irradiation is performed in a first scan performed in the area to be inspected, and
    the second inspection is performed in a second scan performed in the area to be inspected, the second scan of which a scan range overlaps that of the first scan.

4. The semiconductor device inspection method according to claim 1,
    wherein one portion where one of the first inspection irradiation or the second inspection irradiation is performed is located within a region of which diagonal or diameter is a line segment passing through two portions where the other one of the first inspection irradiation or the second inspection irradiation is performed.

5. The semiconductor device inspection method according to claim 4,
    wherein one portion where the one of the first inspection irradiation or the second inspection irradiation is performed is located between two portions where the other one of the first inspection irradiation or the second inspection irradiation is performed.

6. The semiconductor device inspection method according to claim 1,
    wherein at least two portions where one of the first inspection irradiation or the second inspection irradiation is performed are located equidistant from one portion where the other one of the first inspection irradiation or the second inspection irradiation is performed.

7. The semiconductor device inspection method according to claim 1,
    wherein the number of portions where the first inspection irradiation is performed is smaller than the number of portions where the second inspection irradiation is performed.

8. The semiconductor device inspection method according to claim 1,
    wherein a plurality of portions where at least one of the first inspection irradiation or the second inspection irradiation is performed are located at equal intervals from each other.

9. The semiconductor device inspection method according to claim 1, further comprising:
    determining, based on the second information, whether or not to perform a third inspection irradiation on the area to be inspected, the third inspection irradiation being for irradiating the area to be inspected with light while the test signal is being input to the semiconductor device;
    when it is determined that the inspection irradiation is to be performed, performing the third inspection irradiation on at least one portion in the area to be inspected of the semiconductor device to which the test signal is being input, the at least one portion where the third inspection irradiation is to be performed, being different from the portions where the first inspection irradiation and the second inspection irradiation have been performed; and outputting third information indicating presence or absence of a defective portion in the entire of the area to be inspected, based on an output signal output from the semiconductor device during performing the third inspection irradiation, and wherein the at least one portion where the third inspection irradiation is performed is located between one portion where the first inspection irradiation has been performed and one portion where the second inspection irradiation has been performed.

10. A semiconductor device inspection device, comprising:

an optical system configured to irradiate an area to be inspected of a semiconductor device with light;

an irradiation portion setter configured to set a plurality of portions in the area to be inspected as a plurality of irradiation portions of inspection irradiation for irradiating the area to be inspected with light while a test signal is being input to the semiconductor device, wherein each of the plurality of irradiation portions is located in each of a plurality of regions obtained by equally dividing the area to be inspected into four equal parts, and the irradiation portion setter is configured to set a center of each of the plurality of regions as a portion to be irradiated in the inspection irradiation;

an irradiation controller configured to control the optical system to perform the inspection irradiation on the irradiation portion set by the irradiation portion setter in the semiconductor device to which the test signal is being input;

an analyzer configured to output information indicating presence or absence of a defective portion in an entire of the area to be inspected, based on an output signal electrically output from the semiconductor device while the inspection irradiation is being performed by the optical system on the irradiation portion set by the irradiation portion setter; and a scan determiner configured to determine whether or not the inspection irradiation is to be further performed on the area to be inspected by the optical system after the analyzer outputs the information, wherein, when the scan determiner determines that the inspection irradiation is to be further performed, the irradiation portion setter newly sets at least one portion in the area to be inspected, which is different from a portion already set as the irradiation portion and irradiated with light, as the irradiation portion, and the irradiation controller controls the optical system to perform the inspection irradiation on the irradiation portion newly set by the irradiation portion setter.

11. The semiconductor device inspection device according to claim 10, wherein the analyzer generates a two-dimensional image of the area to be inspected, which indicates presence or absence of a defective portion in the entire of the area to be inspected, based on the output signal output from the semiconductor device while the optical system is performing the inspection irradiation on the irradiation portion set by the irradiation portion setter, and outputs the generated image as the information.

12. The semiconductor device inspection device according to claim 10, wherein the irradiation controller causes the optical system to scan the area to be inspected so that the inspection irradiation is performed on the irradiation portion set by the irradiation portion setter in the scan, and when the scan determiner determines that the inspection irradiation is to be further performed, the irradiation controller controls the optical system to scan a range overlapping a range having already been scanned, so that the inspection irradiation is performed on the newly set irradiation portion in the scan.

* * * * *